(12) United States Patent
Chafik et al.

(10) Patent No.: US 12,453,071 B2
(45) Date of Patent: Oct. 21, 2025

(54) GATE SPACER STRUCTURES FOR THREE-DIMENSIONAL SEMICONDUCTOR DEVICES

(71) Applicant: QUALCOMM Incorporated, San Diego, CA (US)

(72) Inventors: Fadoua Chafik, San Diego, CA (US); Xiaochen Zhang, Carlsbad, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 536 days.

(21) Appl. No.: 17/660,758

(22) Filed: Apr. 26, 2022

(65) Prior Publication Data
US 2023/0345692 A1    Oct. 26, 2023

(51) Int. Cl.
*H10B 10/00* (2023.01)
*H10D 64/01* (2025.01)

(52) U.S. Cl.
CPC ......... *H10B 10/125* (2023.02); *H10D 64/015* (2025.01)

(58) Field of Classification Search
CPC . H10B 10/125; H01L 29/6653; H10D 64/015
USPC ....................................................... 257/347
See application file for complete search history.

(56) References Cited

U.S. PATENT DOCUMENTS

| | | | |
|---|---|---|---|
| 7,952,142 B2 | 5/2011 | Wu | |
| 8,492,227 B2 | 7/2013 | Mitsuiki et al. | |
| RE45,060 E | 8/2014 | Teo et al. | |
| 9,490,177 B2 | 11/2016 | Oh et al. | |
| 10,083,972 B2 | 9/2018 | Basker et al. | |
| 2004/0198060 A1* | 10/2004 | Liu | H10D 64/021 257/E21.624 |
| 2005/0179078 A1 | 8/2005 | Lee | |
| 2007/0080401 A1 | 4/2007 | Yang | |
| 2011/0156755 A1* | 6/2011 | Veendrick | H01L 27/0207 326/103 |
| 2011/0199837 A1* | 8/2011 | Reohr | G11C 11/4085 365/189.11 |
| 2015/0145070 A1* | 5/2015 | Song | H01L 21/28123 438/694 |
| 2016/0064236 A1* | 3/2016 | Jang | H01L 21/0337 438/587 |
| 2017/0040315 A1* | 2/2017 | Balakrishnan | H01L 28/20 |
| 2021/0272966 A1 | 9/2021 | Lin et al. | |

(Continued)

OTHER PUBLICATIONS

International Search Report and Written Opinion—PCT/US2023/063195—ISA/EPO—Jun. 19, 2023.

*Primary Examiner* — Eric W Jones
(74) *Attorney, Agent, or Firm* — Muncy, Geissler, Olds & Lowe, P.C.

(57) ABSTRACT

Disclosed are apparatuses and techniques for fabricating an apparatus including a semiconductor device. The semiconductor device may include one or more static random-access memory (SRAM) transistors, each including a first gate spacer structure; one or more logic nominal transistors, each including a second gate spacer structure; and one or more logic gate-biased transistors, each including a third gate spacer structure, where the third gate spacer structure is thinner than the first gate spacer structure and where the one or more SRAM transistors, the one or more logic nominal transistors, and the one or more logic gate-biased transistors each have a same contacted poly pitch (CPP).

31 Claims, 12 Drawing Sheets

(56) References Cited

U.S. PATENT DOCUMENTS

2022/0085161 A1\* 3/2022 Noh ................ H01L 21/823807
2022/0102359 A1    3/2022 Su et al.
2022/0367488 A1\* 11/2022 Su .......................... H10B 20/25

\* cited by examiner

GATE SPACER STRUCTURES FOR THREE-DIMENSIONAL SEMICONDUCTOR DEVICES

BACKGROUND OF THE DISCLOSURE

1. Field of the Disclosure

Aspects of the disclosure relate generally to apparatuses including semiconductor devices and more specifically, but not exclusively, to gate spacer structures in high-density circuits and fabrication techniques thereof.

2. Description of the Related Art

Wireless communication systems have developed through various generations, including a first-generation analog wireless phone service (1G), a second-generation (2G) digital wireless phone service (including interim 2.5G and 2.75G networks), a third generation (3G) high speed data, Internet-capable wireless service and a fourth generation (4G) service (e.g., Long Term Evolution (LTE) or WiMax). There are presently many different types of wireless communication systems in use, including cellular and personal communications service (PCS) systems. Examples of known cellular systems include the cellular analog advanced mobile phone system (AMPS), and digital cellular systems based on code division multiple access (CDMA), frequency division multiple access (FDMA), time division multiple access (TDMA), the Global System for Mobile communications (GSM), etc.

A fifth generation (5G) wireless standard, referred to as New Radio (NR), enables higher data transfer speeds, greater numbers of connections, and better coverage, among other improvements. The 5G standard, according to the Next Generation Mobile Networks Alliance, is designed to provide higher data rates as compared to previous standards, more accurate positioning, and other technical enhancements.

Technology and the progress of the wireless communications are transforming the automotive industry. Modern vehicles can be fully cloud-connected and allow for passengers to connect with the car in a full immersive experience. Modern vehicles that are connected to everything (e.g., wireless connectivity, sensors, etc.) can provide driver assistance that allows greater safety. This level of connectivity comes with very high processing requirements for the car to sense, process and make decisions in real time. The high processing demands are driving the adoption of the most advanced technology nodes in the automotive industry to meet these power-performance needs.

Integrated circuit technology has achieved great strides in advancing computing power through miniaturization of active components and has enabled the practical implementation and commercialization of the aforementioned wireless communication systems and components thereof. However, the miniaturization of circuits and devices can result in fabrication and design challenges. Technologies such as 5 nanometer (nm) and beyond suffer from high defect rates and yield loss due to extremely dense designs. For example, in High Density static random access memory (SRAM) bitcell designs, the Gate-to-Source/Drain (S/D) contact shorts are significant sources of defects in fabrication as well as during qualification. Technology scaling pushes designers to shrink the Gate-to-S/D space, which is even more exacerbated in the SRAM bitcell due to the aggressive designs between various nodes. These shorting defects represent a high defect per million (DPPM) risk for consumer and automotive products. Demanding applications, such as advanced driver-assistance systems (ADAS) products, require high-density SRAM designs to support the computing needs for these type of applications.

The reliability requirements for demanding applications/products, such as ADAS products, may be on the order of 1 DPPM. However, conventional designs including the usage of advanced technology nodes (e.g., 5 nm and beyond) have DPPMs on the order of thousands. Accordingly, there is a need for systems, apparatuses and methods that overcome the deficiencies of conventional gate structures and high-density circuit designs including the methods, systems and apparatuses provided herein in the following disclosure.

SUMMARY

The following presents a simplified summary relating to one or more aspects disclosed herein. Thus, the following summary should not be considered an extensive overview relating to all contemplated aspects, nor should the following summary be considered to identify key or critical elements relating to all contemplated aspects or to delineate the scope associated with any particular aspect. Accordingly, the following summary has the sole purpose to present certain concepts relating to one or more aspects relating to the mechanisms disclosed herein in a simplified form to precede the detailed description presented below.

In accordance with the various aspects disclosed herein, at least one aspect includes, an apparatus comprising a semiconductor device including one or more static random-access memory (SRAM) transistors, each including a first gate spacer structure; one or more logic nominal transistors, each including a second gate spacer structure; and one or more logic gate-biased transistors, each including a third gate spacer structure, wherein the third gate spacer structure is thinner than the first gate spacer structure and wherein the one or more SRAM transistors, the one or more logic nominal transistors, and the one or more logic gate-biased transistors each have a same contacted poly pitch (CPP).

In accordance with the various aspects disclosed herein, at least one aspect includes a method for fabricating a semiconductor device including forming one or more static random-access memory (SRAM) transistors, each including a first gate spacer structure; forming one or more logic nominal transistors, each including a second gate spacer structure; and forming one or more logic gate-biased transistors, each including a third gate spacer structure, wherein the third gate spacer structure is thinner than the first gate spacer structure and wherein the one or more SRAM transistors, the one or more logic nominal transistors, and the one or more logic gate-biased transistors each have a same contacted poly pitch (CPP).

Other objects, features and advantages associated with the apparatus and methods disclosed herein will be apparent to those skilled in the art based on the accompanying drawings and detailed description.

BRIEF DESCRIPTION OF THE DRAWINGS

The accompanying drawings are presented to aid in the description of various aspects of the disclosure and a more complete appreciation of aspects of the disclosure and many of the attendant advantages thereof will be readily obtained as the same becomes better understood by reference to the following detailed description when considered in connec

Figure 1:
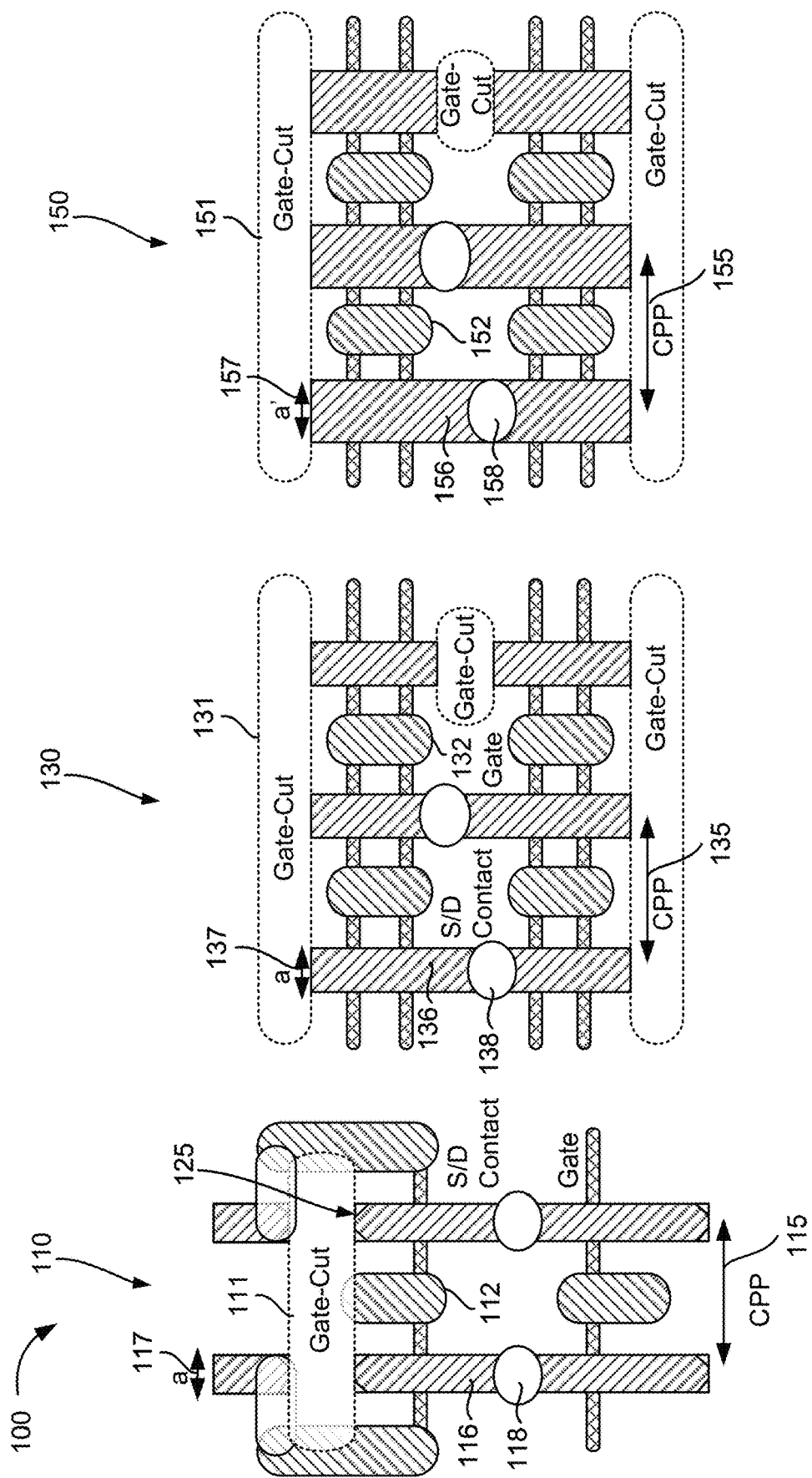
- FIG. 1 illustrates a semiconductor device including an SRAM bitcell, a logic standard cell with nominal device and a logic standard cell with gate-biased device in accordance with one or more aspects of the disclosure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Disclosed Aspects of the present disclosure are illustrated in the following description and related drawings directed to specific aspects of the disclosure. Alternate aspects may be devised without departing from the scope of the teachings herein. Additionally, well-known elements of the illustrative aspects herein may not be described in detail or may be omitted so as not to obscure the relevant details of the teachings in the present disclosure.

In certain described example implementations, instances are identified where various component structures and portions of operations can be taken from known, conventional techniques, and then arranged in accordance with one or more exemplary aspects. In such instances, internal details of the known, conventional component structures and/or portions of operations may be omitted to help avoid potential obfuscation of the concepts illustrated in the illustrative aspects disclosed herein.

The terminology used herein is for the purpose of describing particular aspects only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

As noted in the foregoing, the reliability requirements for demanding applications/products, such as ADAS products, may be on the order of 1 DPPM. However, conventional designs including the usage of advanced technology nodes (e.g., 5 nm and beyond) have DPPMs on the order of 1000s. Conventional designs have tried using conservative designs for reliability and restrict the usage of blocks using minimum spacings that allow best technology scaling (density). For example, some conventional designs have included (1) Increasing the distance between gate and source/drain contact (Gate pitch) in SRAM HD cell. This will increase the bitcell area in the X-direction and thus chip area increase; (2) Increasing the distance between nodes [cross couple]. This will increase the bitcell area in the Y-direction and thus chip area increase; (3) Screen with High Dynamic Voltage Stress and other screening methodologies but found to be insufficient in 5 nm node designs; and (4) Expensive burn-in stress and System-Level Testing but found to be insufficient in 5 nm node designs.

In designs for 5 nm FinFET devices and onwards, with extremely small dimensions, gate-to-S/D shorts are among the top defects for yield and reliability. It has been exceedingly difficult to eliminate these defects using conventional designs and processes. Various products have seen increased customers returns due to these defects. As the quest for high computing System-on-chips continues to rise, the demanding use-cases from autonomous driving, augmented/mixed reality, gaming, smart cities benefit from the adoption of the most advanced technologies such as 5 nm nodes and beyond to meet the computing needs, but this comes with a high risk for reliability and yield.

These shorts are mainly seen in high-density SRAM due to overlap/proximity of the gate-end and the S/D-contact which is used to reach the maximum density offered by the technology (e.g., 5 nm). To design the SRAM HD cells with the highest density, the cell X-Y dimensions cannot be changed in a given technology.

The gate-cut proximity to the S/D-contact creates a systematic process weakness for the Replacement Metal Gate module (e.g., due to residual metal at the edge of the gate). As the S/D-contact is very close to this residual metal, it creates a short potential between the gate (G) and the S/D. This G-to-S/D short is more pronounced in SRAM high-density (HD) cells vs high current (HC) cells because there is less space/separation node-to-node.

In accordance with the various aspects disclosed, apparatuses and semiconductor devices including SRAM transistor structures disclosed herein can be used to improve defectivity (DPPM, Yield) while maintaining a very high design density. At least some of the various aspects disclosed relate to the development of an alternative gate spacer structure scheme for SRAM designs, while maintaining the maximum density offered in a given technology. In some aspects, the gate spacer structure in SRAM transistors and logic nominal transistors has an additional thickness relative to the logic gate-biased transistors, which may have the one or more spacer layers thinned, or one or more spacer layers removed during fabrication. The increased gate spacer structure thickness will eliminate the gate-to-S/D contact shorts in the bitcell without impacting the logic gate-biased transistors in the non-critical path of the design (e.g., in the logic blocks and memory periphery). Conventional solutions to solve gate-to-S/D short defects; either prohibit the usage of the high-density SRAM or increased the outer spacer thickness in all the areas of the chip and prohibit the usage of the logic gate-biased device designs (longer channel device used in logic blocks to reduce leakage and critical for chip static power reduction).

At least some of the various aspects disclosed include a thinner gate spacer structure in the logic gate-biased transistors vs the SRAM transistors (or SRAM and logic nominal transistors) at the same gate pitch/contacted poly pitch (CPP). In some aspects, the gate spacer structure is formed by multiple gate spacer layers and the thickness may be increased, by increasing one or more gate spacer layer thicknesses (or not reducing one or more gate spacer layer thicknesses) relative to logic gate-biased device) or by increasing a number of layers only in SRAM transistors (or SRAM and logic nominal devices). For example, an additional outer spacer layer can be added, or the thickness of the existing outer spacer layer can be increased (or not decreased). In some aspects, the gate spacer structure thickness or number of layers only in the logic gate-biased device can be decreased. In accordance with at least some of the aspects disclosed, this will eliminate (or substantially reduce) the gate-to-S/D contact shorts in the bitcell without impacting the chip/SoC area.

As discussed above, the conventional solutions to solve gate-to-S/D short defects; either prohibit the usage of the HD SRAM or increase the outer spacer thickness in all the areas of the chip and prohibit the usage of the logic gate-biased device (energy efficient device used in logic blocks to reduce leakage/static power). These solutions, used by foundries, are very disruptive to the designs and increase the area and cost of the semiconductor device (e.g., integrated circuit (IC), chip, die, SoC, etc.).

The various aspects disclosed allow for the usage of the foundation blocks of a given technology (e.g., high-density SRAM, logic gate-biased devices, etc.) and maintain desirable chip area/cost, while addressing gate-to-S/D shorts. Further, the various aspects disclosed require little or no additional design effort and, in some aspects, only one additional low-cost mask is used.

FIG. 1 illustrates a portion of a semiconductor device 100 according to at least one aspect of the disclosure. A top-down view of portions of standard cell designs are illustrated. It will be appreciated that standard cell designs may include one or more transistors and in some of the drawings only one transistor element may be referenced or illustrated, but this does not preclude the presence of additional transistors. Further, reference to a specific cell or transistor may apply interchangeably to other similar cells and/or transistors in a cell. Specifically, FIG. 1 illustrates a SRAM high-density (HD) bitcell (SRAM cell 110), a nominal logic transistor cell (logic nominal cell 130) and a logic gate-biased transistor cell (logic gate-biased cell 150). The various transistor cells can include 3D transistor structures (e.g., FinFET, Nanosheet, Nanowire, Vertical FETs, etc.) with epitaxial source/drain regions. It will be appreciated that for a given technology (e.g., 5 nm) there are logic nominal (standard) devices for speed and logic gate-biased devices (larger gate length at the same CPP) for leakage management. Further, it will be appreciated that for design simplicity, improved design density and fabrication standardization, the CPP (e.g., 115, 135 and 155) of each standard design is the same. However, the gate-to-gate space in the logic gate-biased cell 150 is smaller than in the logic nominal cell 130 or SRAM cell 110. It will be appreciated that the first gate length 117 of the SRAM cell 110 and the second gate length 137 of the logic nominal cell 130 are the same (a), but each are smaller than the third gate length 157 (a') of the logic gate-biased cell 150. The SRAM cell 110 further includes source/drain (S/D) contacts 112, gates 116, gate contacts 118 and illustrates gate-cut 111. As discussed above, the portion 125 are weak points for potential gate-to-S/D shorts due to the gate cutting/replacement metal gate processes and close proximity of S/D contacts 112. The logic nominal cell 130 further includes source/drain (S/D) contacts 132, gates 136, gate contacts 138 and illustrates gate-cuts 131. The logic gate-biased cell 150 further includes source/drain (S/D) contacts 152, gates 156, gate contacts 158 and illustrates gate-cuts 151.

It will be appreciated that the SRAM cell 110, the logic nominal cell 130 and the logic gate-biased cell 150 have the same CPP. The first gate length 117 of the SRAM cell 110 and second gate length 137 of the logic nominal cell 130 are the same and are shorter than the third gate length 157 of the logic gate-biased cell 150 on the order of three nanometers (3 nm) or less (e.g., <=3 nm). However, as discussed above and further in the following, the logic gate-biased cell 150 spacer will be thinner than the spacers for the SRAM cell 110 or logic nominal cell 130.

FIGS. 2A-2F illustrate portions of a semiconductor device 200 according to at least one aspect of the disclosure. Specifically, a cross-sectional view of portions of the semiconductor device includes transistors for the SRAM cell 210 in FIG. 2A, logic nominal cell 230 in FIG. 2B and logic gate-biased cell 250 in FIG. 2C.

Figure 2A:
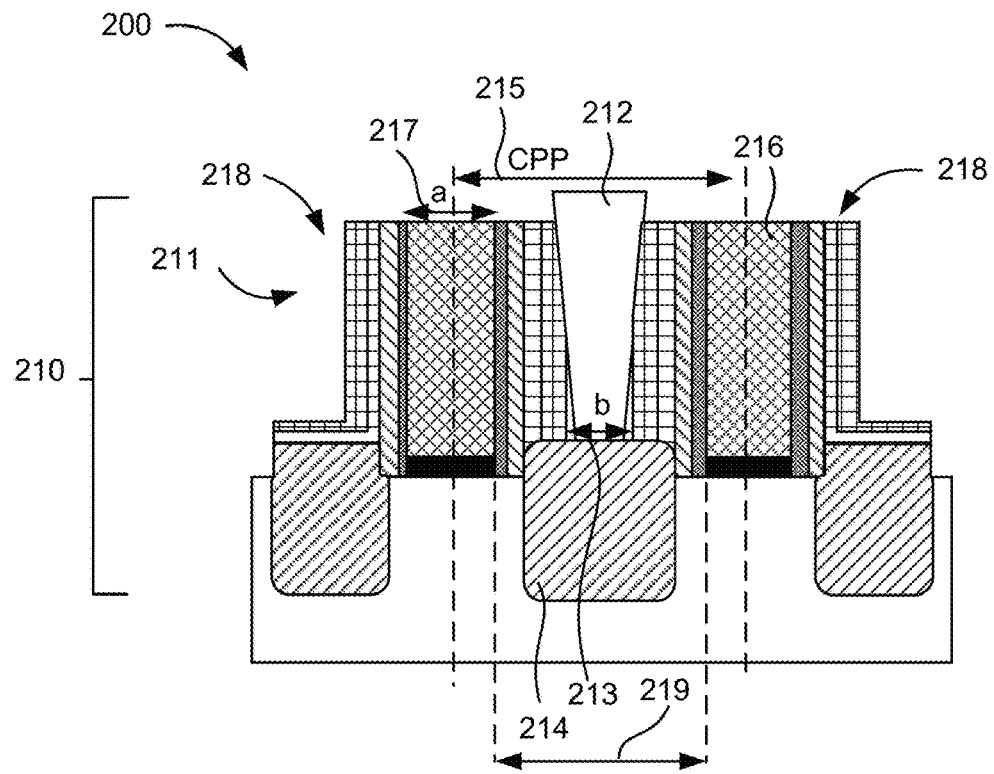
FIGS. 2A-2F illustrate a cross-sectional views of various aspects of semiconductor devices including an SRAM bitcell, a logic standard cell with nominal device and a logic standard cell with gate-biased device in accordance with one or more aspects of the disclosure.

FIG. 2A illustrates a cross-sectional view of portions of the SRAM cell 210 including one or more SRAM transistors 211 according to at least one aspect of the disclosure. The SRAM cell 210 includes a first gate length 217 (also labeled a), with a CPP 215 between gates 216 and gate spacer to gate spacer opening 213 (also labeled b) between gate spacer structures 218. The S/D contact 212 is disposed in opening 213 between the gate spacer structures 218 and contacts the S/D epitaxy region 214 in SRAM cell 210. It will be appreciated that opening 213 is a function of the CPP 215, gate to gate space 219, the first gate length 217 and thickness of the gate spacer structure 218.

Figure 2B:
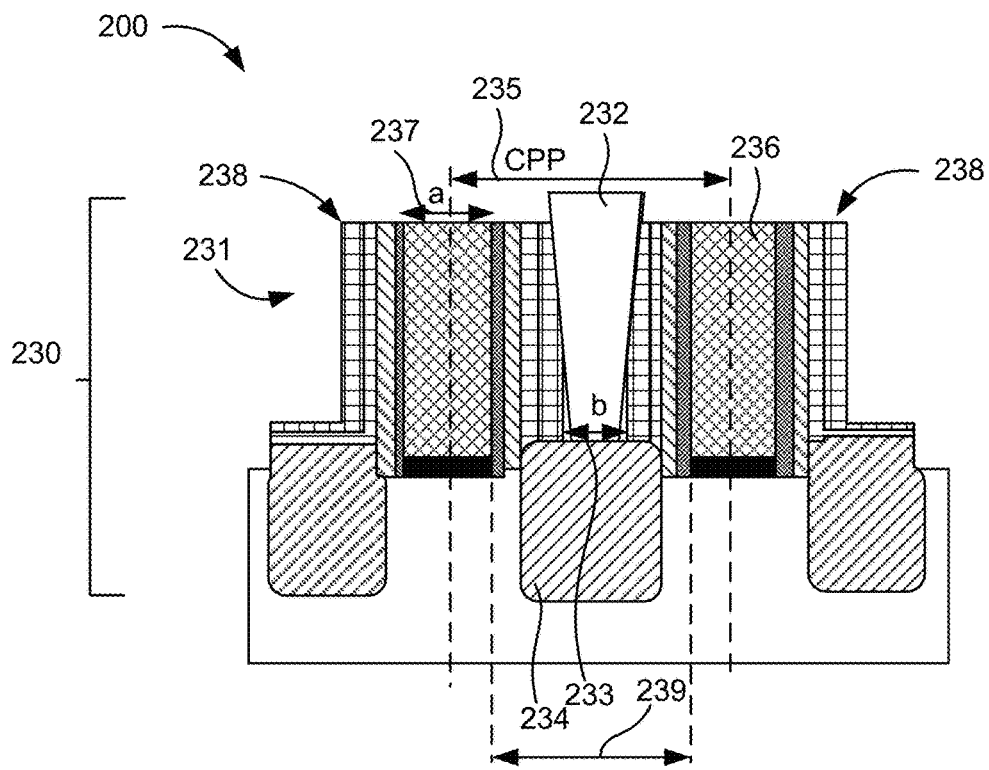

FIG. 2B illustrates a cross-sectional view of portions of the logic nominal cell 230 including one or more logic nominal transistors 231 according to at least one aspect of the disclosure. The logic nominal cell 230 includes a second gate length 237 (also labeled a), with a CPP 235 between gates 236 and gate spacer to gate spacer opening 233 (also labeled b) between gate spacer structures 238. The S/D contact 232 is disposed in opening 233 between the gate spacer structures 238 and contacts the S/D epitaxy region 234 in logic nominal cell 230. It will be appreciated that opening 233 is a function of the CPP 235, gate to gate space 239, the second gate length 237 and thickness of the gate spacer structure 238, which in this illustration is similar to the gate spacer structure 218 of the SRAM cell 210. It will be appreciated that the various aspect disclosed are not limited to the gate spacer structures (218, 238) of the SRAM cell 210 and logic nominal cell 230 being the same.

Figure 2C:
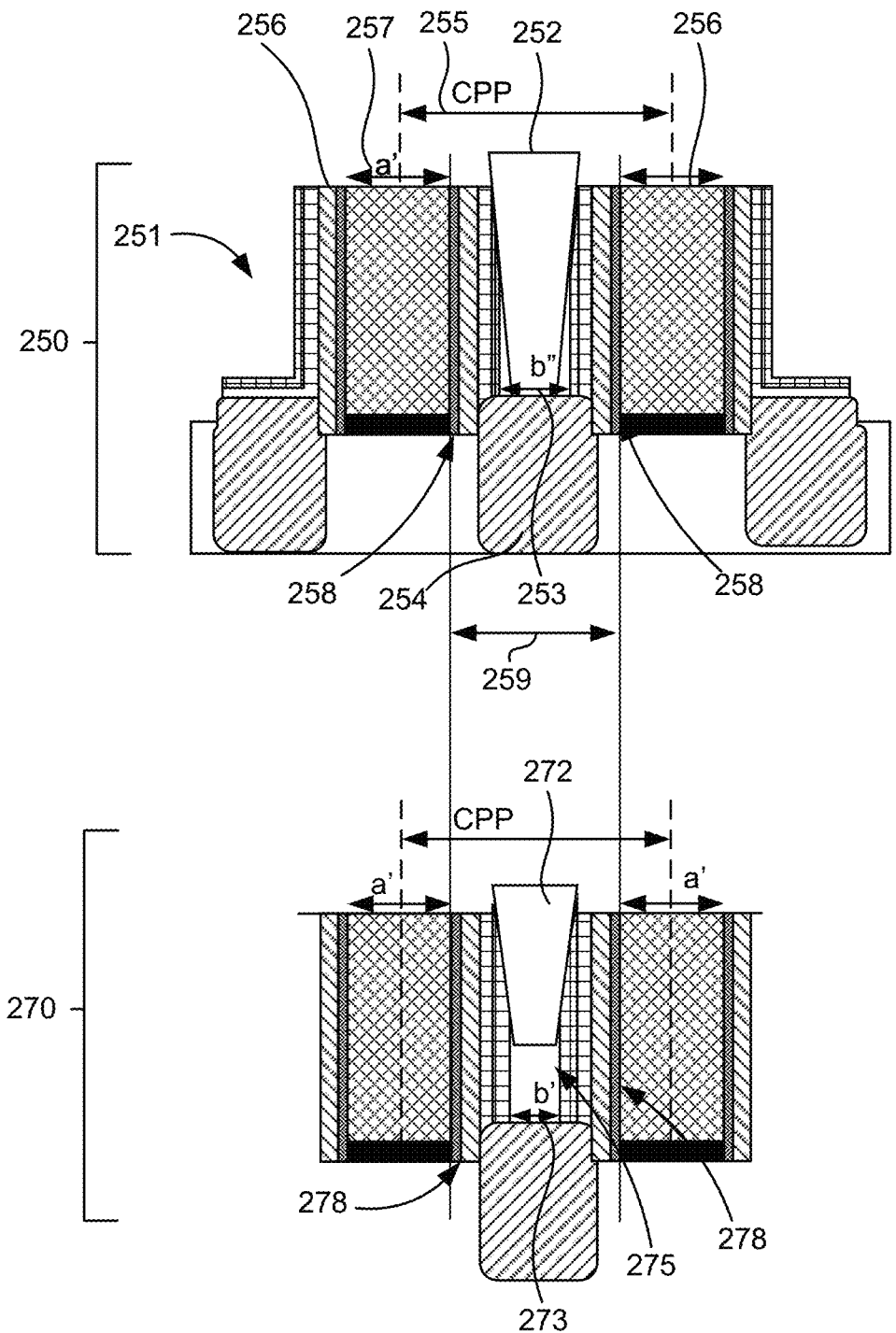

FIG. 2C illustrates a cross-sectional view of portions of the logic gate-biased cell 250 including one or more gate-biased transistors 251 according to at least one aspect of the disclosure. The logic gate-biased cell 250 includes a third gate length 257 (also labeled a'), with a CPP 255 between gates 256 and a gate spacer to gate spacer opening 253 (also labeled b") between gate spacer structures 258. The S/D contact 252 is disposed in opening 253 between the gate spacer structures 258 and contacts the S/D epitaxy region 254 in the logic gate-biased cell 250. It will be appreciated that opening 253 is a function of the CPP 255, gate to gate space 259, the third gate length 257 and thickness of the gate spacer structure 258.

As noted above, the SRAM cell 210, the logic nominal cell 230 and the logic gate-biased cell 250 generally have the same CPP. Further, the second gate length 237 of the logic nominal cell 230 is also the same as the first gate length 217 of the SRAM cell 210. However, the first gate length 217 of the SRAM cell 210 is less than the third gate length 257 of the logic gate-biased cell 250. Each technology (e.g., 5 nm) has a logic nominal device (minimum width) specification for high-frequency operation (e.g., SRAM cell 210 and logic nominal cell 230) and gate-biased devices (e.g., logic gate-biased cell 250), which have larger gate lengths for leakage/energy management. As illustrated, the SRAM cell 210, logic nominal cell 230 and gate-biased cell 250 have the same CPP (e.g., CPP 215, CPP 235 and CPP 255, respectively). However, unlike conventional designs, the reduced gate spacer structure thickness of the logic gate-biased cell 250 allows for an increased opening 253 between gate spacer structures 258, relative to conventional designs, as discussed herein. In the illustrated example, the outer gate spacer layer of gate spacer structure 258 has a reduced thickness in comparison to the outer gate spacer layer of gate spacer structure 218 in FIG. 2A. However, it will be appreciated that the various aspects are not limited to this illustrated configuration, which is provided solely as an example to aid in the discussion of the various aspects disclosed.

Further, as illustrated in FIG. 2C, in the various aspects disclosed the gate spacer structure 258 to gate spacer structure 258 opening 253 (b") in the logic gate-biased cell 250 is greater than gate spacer structure 278 to gate spacer structure 278 opening 273 (b') (e.g., the space between gate spacer structures) in the conventional logic gate-biased cell 270. It will be appreciated that the conventional logic gate-biased cell 270 and gate spacer structure 278 are only partially illustrated and solely provided for purposes of comparison. Controlling the thickness of the gate spacer structure 258 of the logic gate-biased cell 250 to have thinner dimensions than the SRAM cell 210 (or conventional logic gate-biased designs) helps to ensure a sufficient opening 253 to the S/D epitaxy region 254 to allow for the formation and connection of the S/D contact 252. Since the gate-to-gate space 219 of the SRAM cell 210, is greater than the gate-to-gate space 259 of the logic gate-biased cell 250, this would reduce the opening (e.g., 253)/space between the gate spacer structures 258, if the thickness of the gate spacer structures was not reduced, relative to the gate spacer structure 218 of SRAM cell 210. In contrast, conventional techniques, may for example, use a blanket increase of the outer spacer (e.g., 4th spacer in this illustration of the overall chip) to address gate to S/D shorts in the bitcell. However, as illustrated in the conventional logic gate-biased cell 270, this can result in an increase in an "S/D contact Not-Open" issue (i.e., the opening 273 being too narrow, which prevents the S/D contact 272 from making a sufficient connection to the S/D epitaxy region) in the logic gate-biased cell 270 resulting in an opening 275 below the S/D contact 272.

In contrast, in accordance with the various aspects disclosed, in the logic gate-biased cell 250, the gate spacer structure 258 is thinner relative to the gate spacer structure 218 of the SRAM cell 210 (or SRAM cell 210 and logic nominal cell 230) to prevent an overly narrow S/D contact opening 253. In some aspects, the semiconductor device 200 includes one or more static random-access memory (SRAM) transistors 211, each including the first gate spacer structure 218, one or more logic nominal transistors 231, each including the second gate spacer structure 238. Additionally, the semiconductor device 200 includes one or more logic gate-biased transistors 251, each including the third gate spacer structure 258. The third gate spacer structure 258 is thinner than the first gate spacer structure 218 or the first and the second gate spacer structures (218 and 238). The first gate spacer structure 218 has a first thickness, and the second gate spacer structure 238 has a second thickness and the third gate spacer structure 258 has a third thickness. In some aspects, the first thickness or the first and the second thicknesses are 20%-30% greater than the third thickness. In some aspects, the first thickness is 8.5 nm to 9 nm. In some aspects, the second and third thickness may be the same. In other aspects, the second thickness may be less than the first thickness and greater than the third thickness.

Figure 2D:
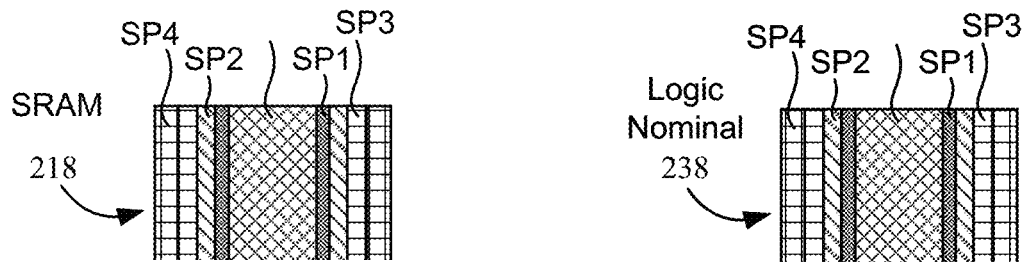
Figure 2E:
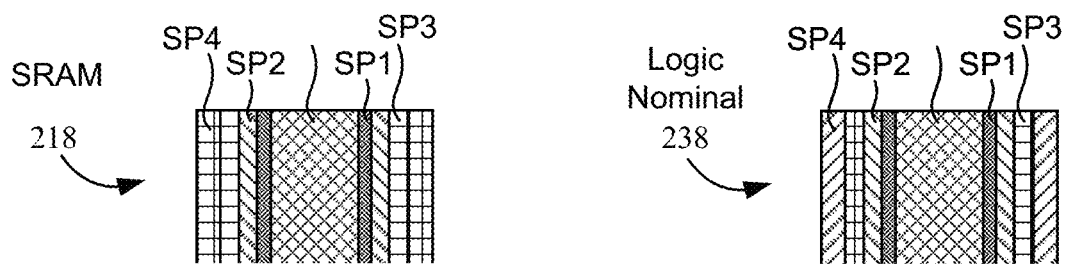
Figure 2F:
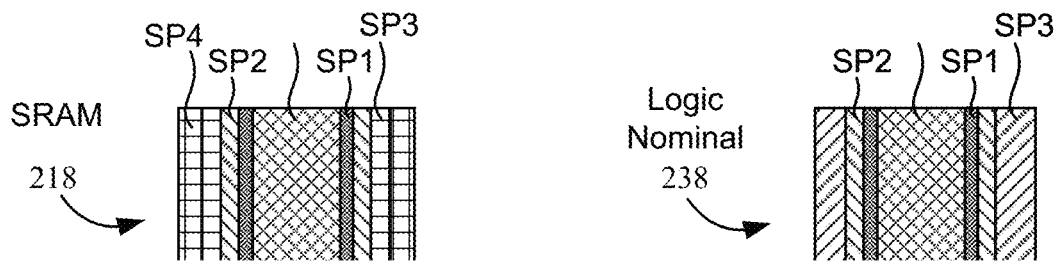

In some aspects, as illustrated in FIG. 2D, the first gate spacer structure 218 of SRAM transistor 211 and the second gate spacer structure 238 of logic nominal transistor 231 may comprise the same material, the same number of spacer layers (e.g., SP1, SP2, SP3 and SP4) and same thickness. In some aspects, as illustrated in FIG. 2E, the first gate spacer structure 218 of SRAM transistor 211 and the second gate spacer structure 238 of logic nominal transistor 231 may comprise one or more spacer layers (e.g., SP1, SP2, SP3 and SP4) having different material, but the same number of spacer layers and same thickness. In some aspects, as illustrated in FIG. 2F, the first gate spacer structure 218 of SRAM transistor 211 and the second gate spacer structure 238 of logic nominal transistor 231 may comprise a different number of spacer layers. For example, the first gate spacer structure 218 may include spacer layers SP1, SP2, SP3 and SP4. In contrast, the second gate spacer structure 238 may include spacer layers SP1, SP2 and SP3. In some aspects, one or more of the spacer layers may be formed from different materials. Further, in some aspects, the first gate spacer structure 218 of SRAM transistor 211 and the second gate spacer structure 238 of logic nominal transistor 231 may have a different thickness, with the second gate spacer structure 238 being thinner than the first gate spacer structure 218.

It will be appreciated from the illustrated example configurations, that the various aspects disclosed are not limited to one configuration of the gate spacer structures or relations between the gate spacer structures of the different transistors. For example, in some aspects, the first gate spacer structure 218 (or the first and second gate spacer structures 218 and 238) comprise a first material and a second material and the third gate spacer structure 258 comprises the second material. In some aspects, the first gate spacer structure 218 (or the first and second gate spacer structures 218 and 238) and the third gate spacer structure 258, each comprise at least one of silicon nitride, silicon dioxide, silicon boride, silicon carbide, oxi-nitride, or combinations thereof. In some aspects, the thickness of the first gate spacer structure 218 (or the first and second gate spacer structures 218 and 238) may be increased by adding one or more additional spacer layers to the first gate spacer structure 218 (or the first and second gate spacer structures 218 and 238) in comparison to the third gate spacer structure 258.

In some aspects, each of the SRAM transistors 211, the logic nominal transistors 231 and the logic gate-biased transistors 251, are three-dimensional transistors (3D transistors), such as FinFET, Nanosheet, Nanowire, and/or Vertical FETs. In some aspects, the SRAM transistors 211/SRAM cell 210, the logic nominal transistors 231/cell 230 and the logic gate-biased transistors 251/cell 250 each have a same contacted poly pitch (CPP), which can be set to the minimum for a given technology (e.g., 5 nm). In some aspects, the SRAM transistors 211 and the logic nominal transistors 231 each have a first gate length 217 and second gate length 237 (also labeled a) and the logic gate-biased transistors 251 each have a third gate length 257 (also labeled a'), where the third gate length 257 is greater than the first gate length 217 and second gate length 237 (i.e., a'>a). It will be appreciated that the various illustrations provided herein are merely provided to aid in the explanation of the various aspects and are not drawn to any specific scale or relative sizing of components or layers. Accordingly, the various aspects disclosed are not limited to the illustrated examples provided in the accompanying figures.

Figure 3:
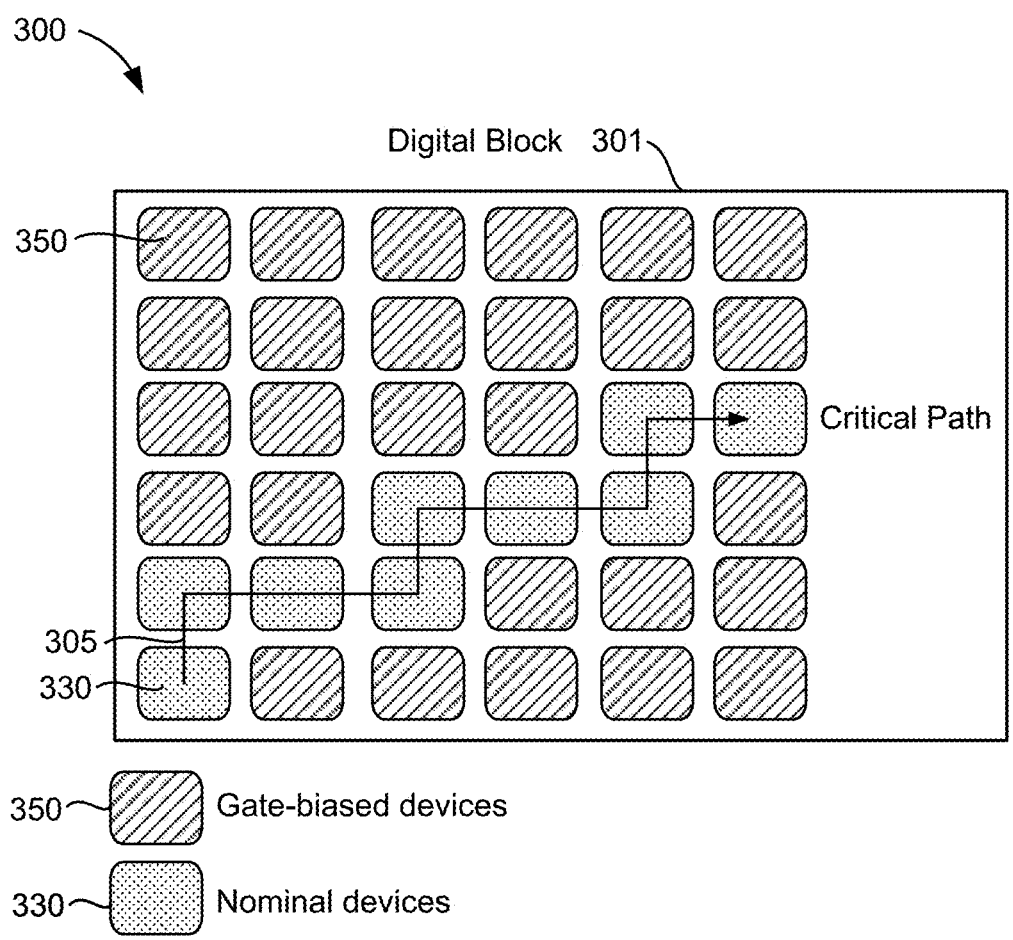
FIG. 3 illustrates a simplified view of a logic block within an SoC in accordance with one or more aspects of the disclosure.

FIG. 3 illustrates a semiconductor device 300 according to at least one aspect of the disclosure. In the plan view illustrated, the semiconductor device 300 includes a plurality of logic nominal transistor cells (logic nominal cells 330) and logic gate-biased transistor cells (logic gate-biased cells 350). The logic nominal cells 330 are disposed on a critical path 305 (e.g., the path of the longest time delay, the path that limits the operating frequency of a digital block 301, processor, etc. of the semiconductor device 300). As discussed above, the logic nominal cells 330 support high frequency, while the logic gate-biased cells 350 have reduced leakage, but also reduced switching speed. It will be appreciated that by using the logic nominal cells 330 in the critical path and logic gate-biased cells 350 in other portions, the semiconductor device 300 design can be optimized to provide very high speed and very low leakage designs without impacting the area used, for a given technology.

In order to fully illustrate aspects of the design of the present disclosure, methods of fabrication are presented. Other methods of fabrication are possible and discussed fabrication methods are presented only to aid in the understanding of the concepts disclosed herein.

FIGS. 4A to 4F illustrate fabrication techniques in accordance with one or more aspects of the disclosure. It will be appreciated that the following fabrication process is provided merely as a general illustration of some of the aspects of the disclosure and is not intended to limit the disclosure or accompanying claims. Further, many details in the fabrication process known to those skilled in the art may be omitted or combined in summary process portions to facilitate an understanding of the various aspects disclosed without a detailed rendition of each detail and/or all possible process variations.

For example, the fabrication process can follow several initial stages, such as the source/drain (S/D) formation, using a PMOS first process. However, the NMOS first process may be used. In some aspects, the process can include PMOS spacer deposition and SRAM PMOS (pull-up) patterning and etch (A mask). The process can continue with the logic PMOS patterning and etch (B mask). The process can continue with SRAM and logic PMOS epitaxial growth. The process can continue with logic and SRAM NMOS spacer deposition, patterning and NMOS epitaxial growth (C mask). At this stage additional details will be provided in the following.

Figure 4A:
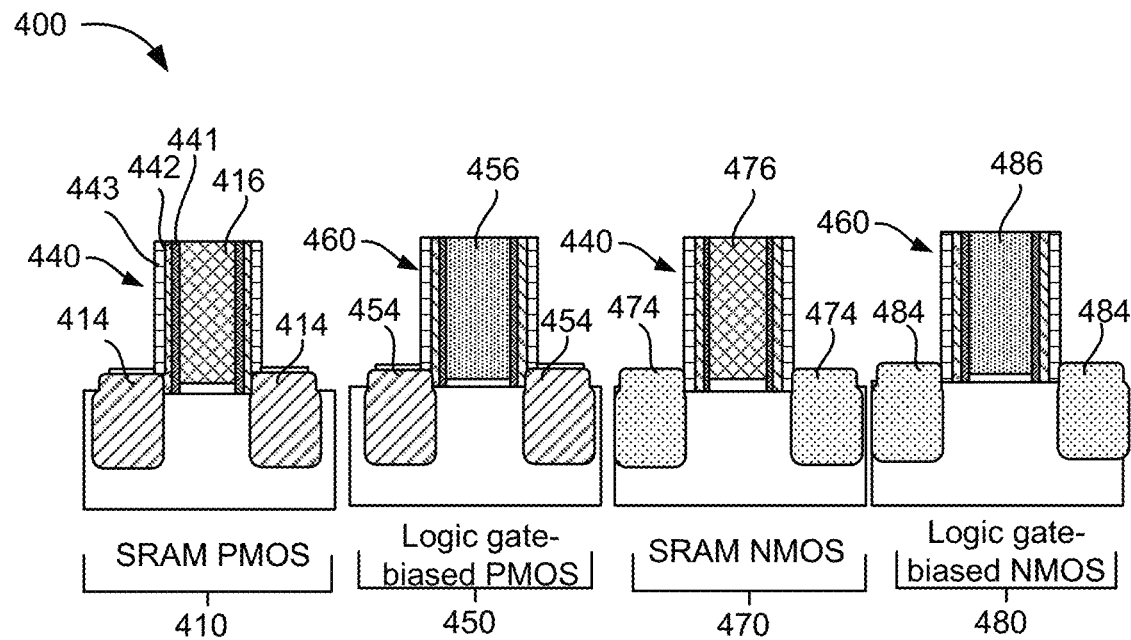
FIGS. 4A-4F illustrate portions of one or more processes for manufacturing a semiconductor device in accordance with one or more aspects of the disclosure.

Referring to FIG. 4A, a portion of the fabrication process of a semiconductor device 400 is illustrated, according to at least one aspect of the disclosure. Cross-sectional views of PMOS SRAM transistors 410, PMOS logic gate-biased transistors 450, NMOS SRAM transistors 470, and NMOS logic gate-biased transistors 480 are illustrated. The logic nominal transistors are not expressly illustrated. However, it will be appreciated that in accordance with the various aspects disclosed, in some aspects that the logic nominal transistors may be processed with the SRAM transistors 410 and will accordingly have a gate spacer structure which is generally the same as the SRAM transistors 410. In other aspects, the logic nominal transistors may be processed with the logic gate-biased transistors 480 and will accordingly have a gate spacer structure which is generally the same as logic gate-biased transistors 480. It will be appreciated, that either of these options can be achieved with the use of one additional mask as discussed herein. However, in other alternative embodiments, the logic nominal transistors may be processed differently from both the SRAM transistors 410 and logic gate-biased transistors 480 using additional masks and processing to include designs where gate spacer structures of the logic nominal transistors are different than the SRAM transistors 410, as discussed herein (e.g., FIGS. 2D to 2F). Accordingly, the various aspects disclosed herein are not limited to the alternative configuration of the logic nominal transistors having the same gate spacer structure as either the SRAM transistors 410 or the logic gate-biased transistors 480, which will be discussed in the following.

As discussed above, the PMOS source/drain epitaxial regions 414 and 454 for the PMOS transistors 410 and 450 and NMOS source/drain epitaxial regions 474 and 484 for the NMOS transistors 470 and 480 have been fabricated. Additionally, the gates 416, 456, 476 and 486 of the PMOS SRAM transistors 410, PMOS logic gate-biased transistors 450, NMOS SRAM transistors 470, and NMOS logic gate-biased transistors 480, respectively, are illustrated. Each gate 416, 456, 476 and 486 has a gate spacer structure 440, 460, 440 and 460, respectively, partially formed from a plurality of spacer layers 441, 442 and 443. It will be appreciated that the various aspects are not limited to a specific number of spacer layers. Further, each layer illustrated may be formed from the deposition of one or more layers of material. As discussed above, a first gate spacer structure 440 is formed for gates 416 and 476 of the SRAM transistors 410 and 470 and a third gate spacer structure 460 is formed for gates 456 and 486 of the logic gate-biased transistors 450 and 480. In some aspects, where the logic nominal transistors are processed with the SRAM transistors or logic gate-biased transistors, the second gate spacer structure of the logic nominal transistors will be either as illustrated in 440 or 460. Accordingly, specific illustrations of the second gat spacer structure will not be provided herein.

Figure 4B:
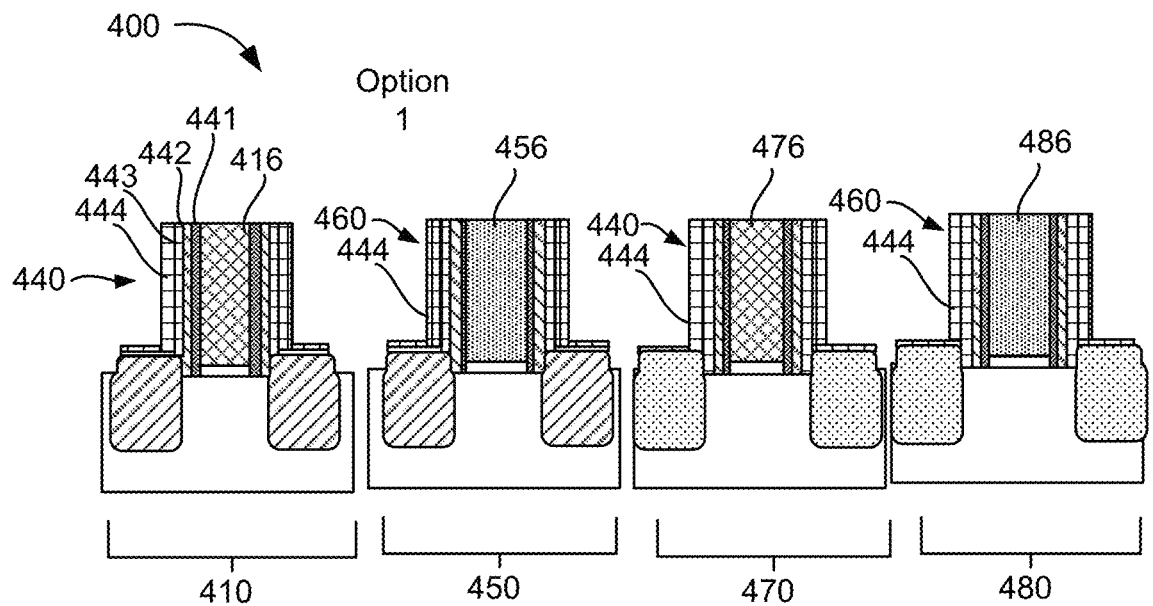

Referring to FIG. 4B, a portion of the fabrication process of the semiconductor device 400 is illustrated, according to at least one aspect of the disclosure. The process continues with a first option having a blanket (e.g., over all regions) outer layer deposition (e.g., in this illustration a fourth spacer layer 444). The spacer layer 444 increases the thickness of the first gate spacer structure 440 for gates 416 and 476 of the SRAM transistors 410 and 470 and the third gate spacer structure 460 for gates 456 and 486 of the logic gate-biased transistors 450 and 480. The spacer layer 444 may be formed of one or more layers of same material to build up the thickness of the first gate spacer structure 440 and the third gate spacer structure 460 at this stage of the process.

Figure 4C:
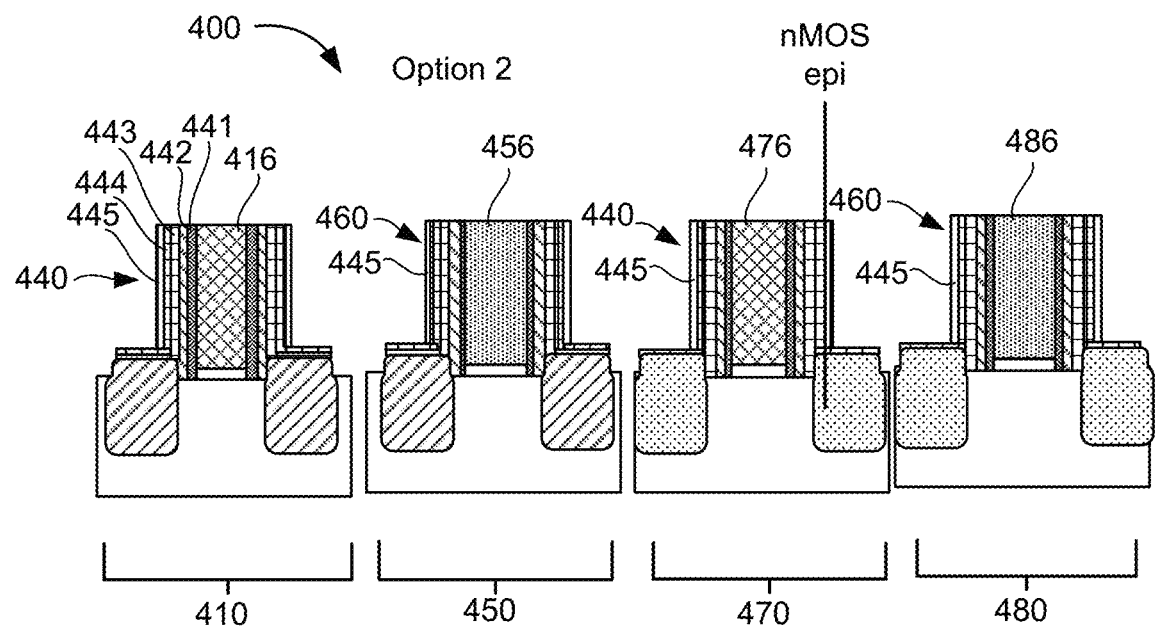

Referring to FIG. 4C, a portion of the fabrication process of the semiconductor device 400 is illustrated, according to at least one aspect of the disclosure. The process continues with a second option having a blanket fourth spacer layer 444 and fifth spacer layer 445 deposition (e.g., over all regions). It will be appreciated that the specific number of layers (e.g., fourth and fifth) are provided solely for illustration and should not be construed to limit the various aspects disclosed or claimed to any specific number of layers. The deposition of spacer layer 444 and spacer layer 445 increases the thickness of the first gate spacer structure 440 for gates 416 and 476 of the SRAM transistors 410 and 470 and the third gate spacer structure 460 for gates 456 and 486 of the logic gate-biased transistors 450 and 480. The spacer layer 445 may comprise a different material than the spacer layer 444. At this stage of the process, both the first gate spacer structure 440 and the third gate spacer structure 460 comprise the spacer layer 444 and spacer layer 445.

Figure 4D:
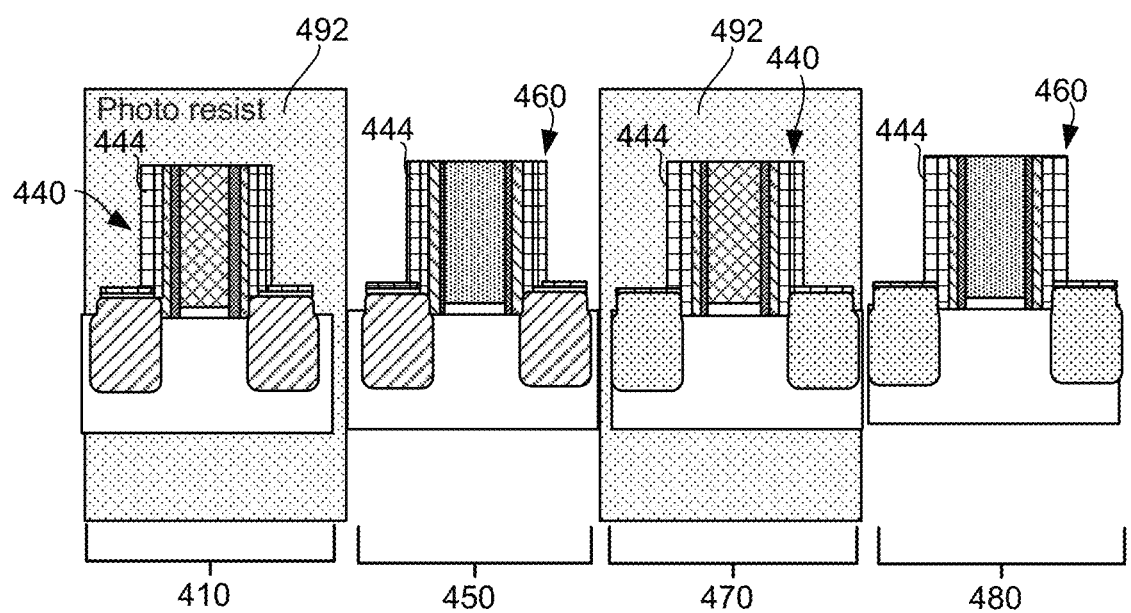

Referring to FIG. 4D, a portion of the fabrication process of the semiconductor device 400 is illustrated, according to at least one aspect of the disclosure. The process continues with a photo resist 492 being deposited and patterned, so that PMOS SRAM transistors 410 and NMOS SRAM transistors 470 are blocked. The PMOS logic gate-biased transistors 450 and NMOS logic gate-biased transistors 480 are open. In this and the following illustrated aspects for the convenience of illustration, the spacer configuration of the first option is used, where the spacer layer 444 is the outer layer of both the first gate spacer structure 440 and the third gate spacer structure 460. However, it will be appreciated that this process and the following can also be applied to the configuration of the second option in FIG. 4C. Additionally, it will be appreciated that only one additional mask (D mask) may be used to perform the processes discussed herein. The additional mask can be generated using existing markers. Additionally, the outer spacer layer (e.g., 444 or 445) materials can be different from other spacer layers to better control the etch process.

Figure 4E:
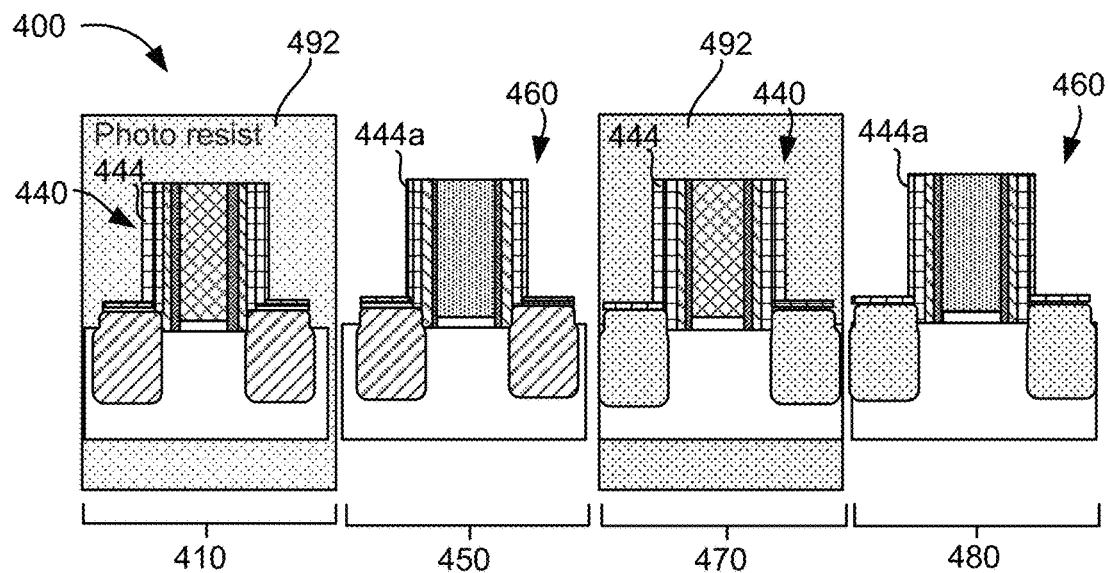

Referring to FIG. 4E, a portion of the fabrication process of the semiconductor device 400 is illustrated, according to at least one aspect of the disclosure. The process continues with an etching process. The photo resist 492 covers the PMOS SRAM transistors 410 and the NMOS SRAM transistors 470 during the etching process. Spacer layer 444*a* is the outer layer of the third gate spacer structure 460 of the PMOS logic gate-biased transistors 450 and NMOS logic gate-biased transistors 480, which is exposed to the etch process. Accordingly, the spacer layer 444*a* is thinner than the spacer layer 444 of the first gate spacer structure 440 after the etch process and the third gate spacer structure 460 is thinner than the first gate spacer structure 440.

Figure 4F:
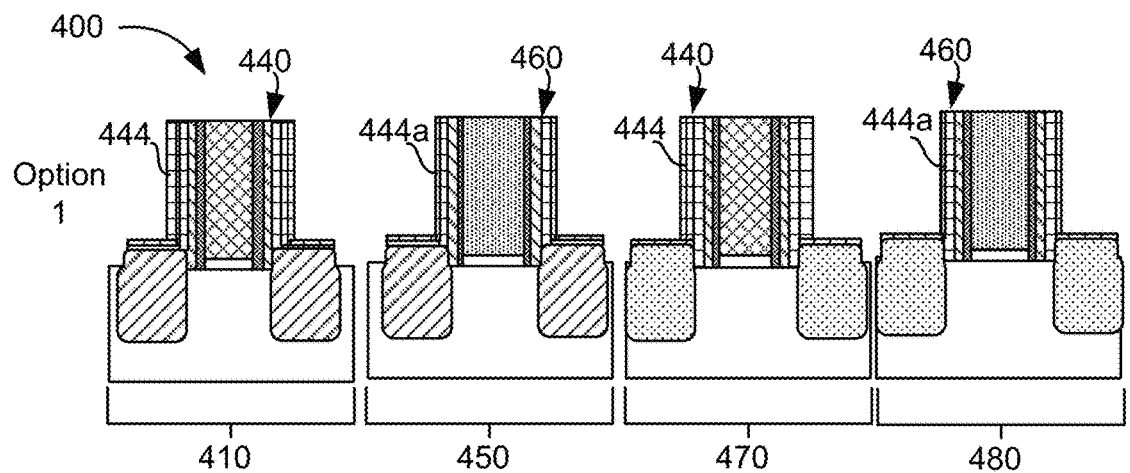
Figure 4F:
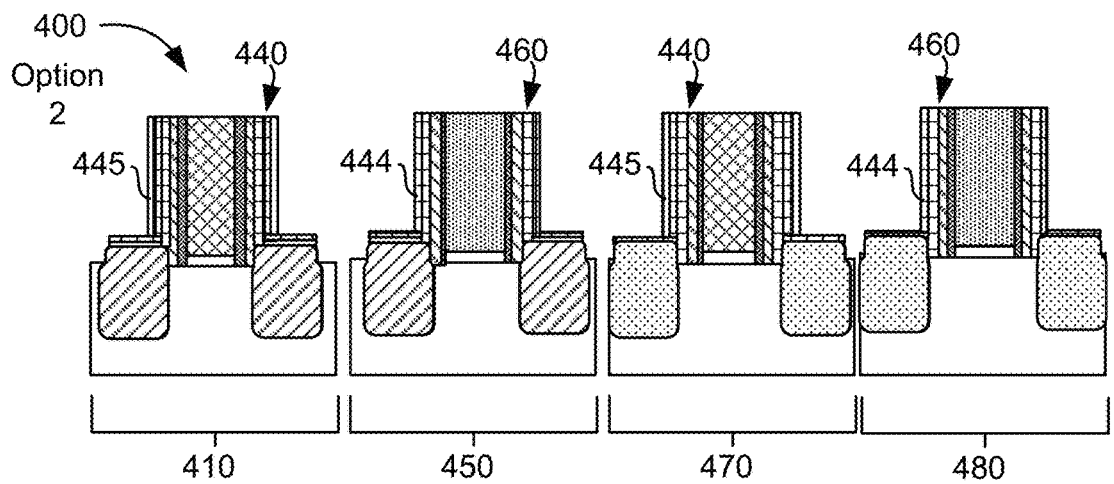

Referring to FIG. 4F, a portion of the fabrication process of the semiconductor device 400 is illustrated, according to at least one aspect of the disclosure. The process continues with the photo resist 492 being removed. The PMOS SRAM transistors 410, PMOS logic gate-biased transistors 450, NMOS SRAM transistors 470, and NMOS logic gate-biased transistors 480 for option 1 and option 2 are illustrated. In option 1, the spacer layer 444*a* is the outer layer of the third gate spacer structure 460 and is thinner than the spacer layer 444, which is the outer layer of the first gate spacer structure 440, as discussed above. In option 2, the spacer layer 444 is the outer layer of the third gate spacer structure 460 and the spacer layer 445 is the outer layer of the first gate spacer structure 440. Accordingly, the first gate spacer structure 440 has an additional spacer layer and therefore the third gate spacer structure 460 is thinner than the first gate spacer structure 440.

In some aspects, the fabrication process can continue from either option with a gate cut process, replacement metal gate process and further fabrication of the semiconductor device 400, as is known in the art, so further details will not be provided. It will be appreciated, that the various aspects are not limited to proceeding with the gate cut process and replacement metal gate process discussed, as additional and/or alternative conventional processing steps may be performed in relation to the fabrication of the semiconductor device 400. For example, in some aspects, where the SRAM transistors differ from logic nominal transistors, the mask definition (e.g., D' mask) will be different. In this design, the SRAM transistors will be blocked while logic nominal transistors and logic gate-biased transistors are open resulting in the same gate spacer structure for the logic nominal transistors and logic gate-biased transistors. In further aspects, additional masks and processing steps can be used during fabrication to provide designs where the SRAM transistors, logic nominal transistors and logic gate-biased transistors each have gate spacer structures that differ. Accordingly, the various aspects disclosed are not limited to the illustrated process steps as additional and/or alternative processing steps may be performed in relation to the fabrication of semiconductor devices as disclosed herein.

Figure 5:
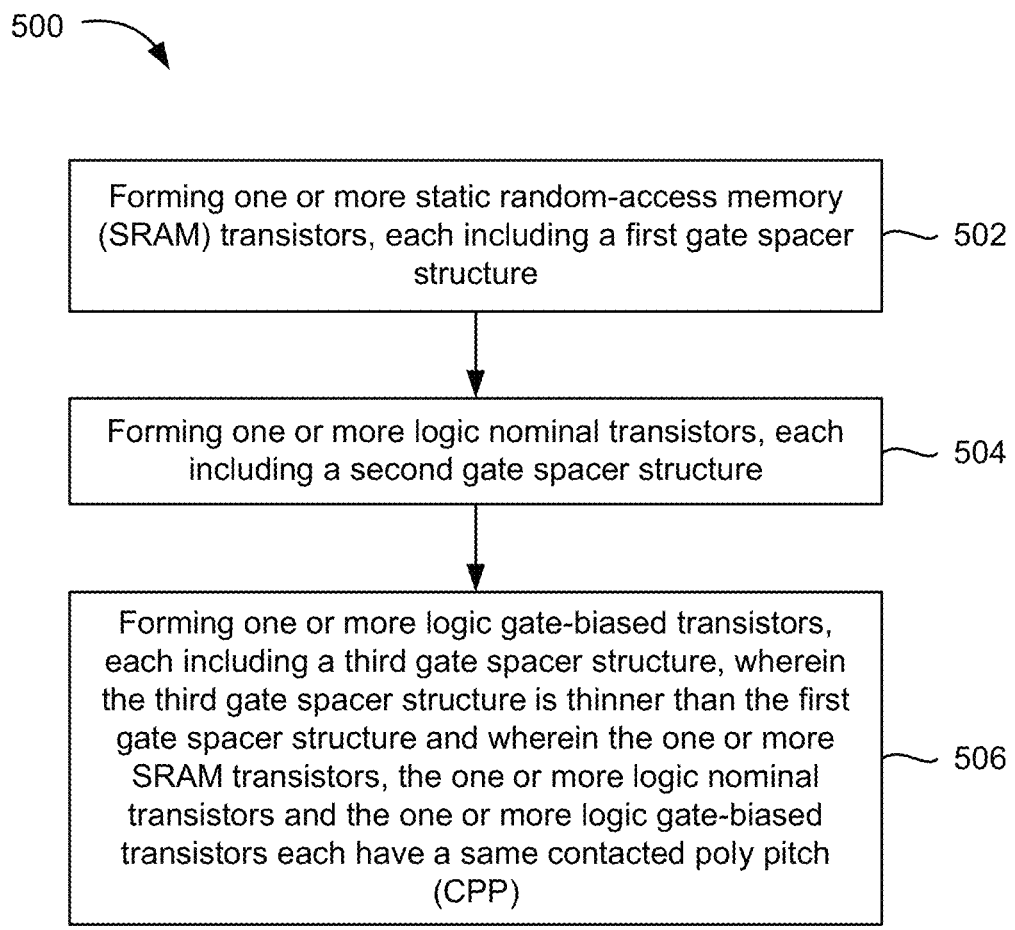
FIG. 5 illustrates a flowchart of a method for manufacturing a semiconductor device in accordance with one or more aspects of the disclosure.

It will be appreciated from the foregoing that there are various methods for fabricating semiconductor devices as disclosed herein. FIG. 5 illustrates a simplified flowchart of a method 500 for fabricating semiconductor devices in accordance with the one or more aspects disclosed. The method 500 may begin in block 502 with forming one or more static random-access memory (SRAM) transistors, each including a first gate spacer structure. The method may continue in block 504 with forming one or more logic nominal transistors, each including a second gate spacer structure. The method may continue in block 506 with forming one or more logic gate-biased transistors, each including a third gate spacer structure, wherein the third gate spacer structure is thinner than the first gate spacer structure and wherein the one or more SRAM transistors, the one or more logic nominal transistors and the one or more logic gate-biased transistors each have a same contacted poly pitch (CPP).

It will be appreciated from the foregoing disclosure that additional processes for fabricating the various aspects disclosed herein will be apparent to those skilled in the art and a literal rendition of the processes discussed herein will not be provided or illustrated in the included drawings. Further, it will be appreciated that the sequence of the fabrication processes is not necessarily in any order and may be performed simultaneously and/or later processes may be discussed earlier for the convenience of describing the various aspects disclosed.

Figure 6:
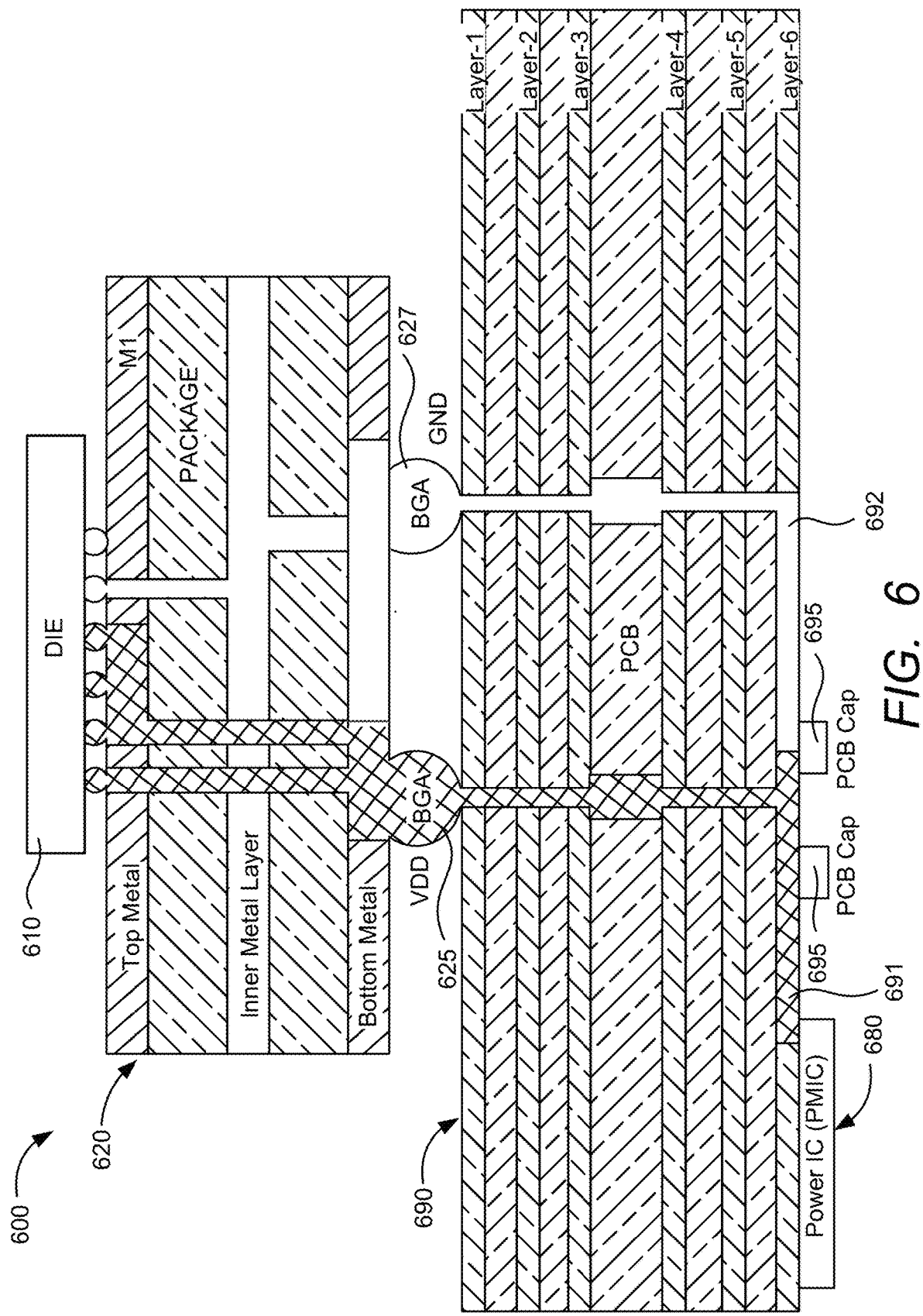
FIG. 6 illustrates components of an apparatus according to one or more aspects of the disclosure.

FIG. 6 illustrates components of an apparatus 600 according to one or more aspects of the disclosure. Regardless of the various configurations of the semiconductor device 610 (e.g., die, SOC, etc.), each includes one or more of the transistors having the first, second and third gate spacer structures discussed above. In the illustrated aspect, a package 620 may be configured to couple the semiconductor device 610 to a PCB 690. In some aspects, it will be appreciated that the semiconductor device 610 may be directly coupled to the PCB 690. The PCB 690 is also coupled to a power supply 680 (e.g., a power management integrated circuit (PMIC)), which allows the package 620 and the semiconductor device 610 to be electrically coupled to the PMIC 680. Specifically, one or more power supply (VDD) lines 691 and one or more ground (GND) lines 692 may be coupled to the PMIC 680 to distribute power to the PCB 690, package 620 via VDD BGA pin 625 and GND BGA pin 627 and to the semiconductor device 610. The VDD line 691 and GND line 692 each may be formed from traces, shapes, or patterns in one or more metal layers of the PCB 690 (e.g., layers 1-6) coupled by one or more vias through insulating layers separating the metal layers 1-6 in the PCB 690. The PCB 690 may have one or more PCB capacitors (PCB cap) 695 that can be used to condition the power supply signals, as is known to those skilled in the art. Additional connections and devices may be coupled to and/or pass through the PCB 690 to the package 620 via one or more additional BGA pins (not illustrated) on the package 620. It will be appreciated that the illustrated configuration and descriptions are provided merely to aid in the explanation of the various aspects disclosed herein. For example, the PCB 690 may have more or less metal and insulating layers, there may be multiple lines providing power to the various components, etc. Accordingly, the forgoing illustrative examples and associated figures should not be construed to limit the various aspects disclosed and claimed herein.

In accordance with the various aspects disclosed herein, at least one aspect includes an apparatus including: a semiconductor device (e.g., 100, 200, 300, and 400) having one or more static random-access memory (SRAM) transistors (e.g., 211, 410, 470), each including a first gate spacer structure (e.g., 218, 440); one or more logic nominal transistors (e.g., 231), each including a second gate spacer structure (e.g., 218, 440); and one or more logic gate-biased transistors (e.g., 251, 450, 480), each including a third gate spacer structure (e.g., 258, 460), wherein the third gate spacer structure is thinner than the first gate spacer structure and wherein the one or more SRAM transistors, the one or more logic nominal transistors and the one or more logic gate-biased transistors each have a same contacted poly pitch (CPP). The various aspects disclosed provide various technical advantages. For example, in at least some aspects, the features of having a thinner third gate spacer structure allows for improved leakage performance, while the relatively thicker first gate spacer structure of the SRAM and thicker second gate spacer structure of the logic nominal devices allows for improved speed/operating frequency, while maintaining the same CCP. The feature having a thinner third gate spacer structure in the logic gate-biased transistors relative to the gate spacer structure in the SRAM or SRAM and/logic nominal devices allows for improved yield and reliability and also allows for improved manufacturability, while maintaining the same CPP. The co-existence and co-optimization for both nominal and gate-biased devices is important in overall product leakage and performance. Other technical advantages will be recognized from various aspects disclosed herein and these technical advantages are merely provided as examples and should not be construed to limit any of the various aspects disclosed herein.

Figure 7:
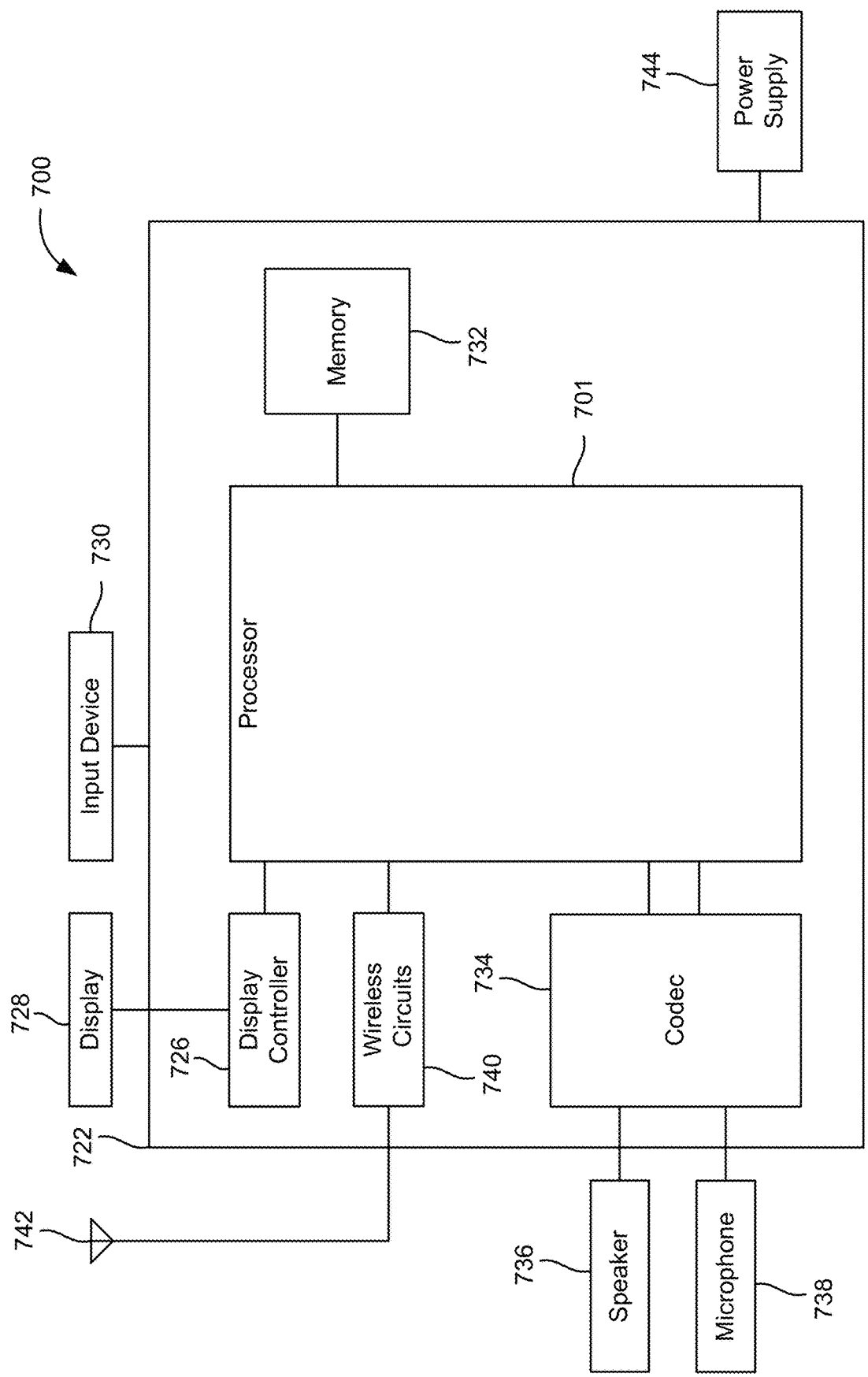
FIG. 7 illustrates an exemplary user device in accordance with one or more aspects of the disclosure.

FIG. 7 illustrates an exemplary user device in accordance with some examples of the disclosure. Referring now to FIG. 7, a block diagram of a user device that is configured according to exemplary aspects is depicted and generally designated user device 700. In some aspects, the user device 700 may be configured as a wireless communication device. As shown, the user device 700 includes processor 701. The processor 701 may be communicatively coupled to memory 732 over a link, which may be a die-to-die or chip-to-chip link. The user device 700 also includes display 728 and display controller 726, with the display controller 726 coupled to the processor 701 and to the display 728.

In some aspects, FIG. 7 may include coder/decoder (CODEC) 734 (e.g., an audio and/or voice CODEC) coupled to the processor 701; speaker 736 and microphone 738 coupled to the CODEC 734; and wireless circuits 740 (which may include a modem, RF circuitry, filters, etc.) coupled to wireless antenna 742 and to the processor 701.

In a particular aspect, where one or more of the above-mentioned digital blocks (including the SRAM, logic nominal and logic gate-biased transistors) are present, the processor 701, the display controller 726, the memory 732, the CODEC 734, and/or the wireless circuits 740 can be included in a system-in-package or system-on-chip device 722. Input device 730 (e.g., physical, or virtual keyboard), power supply 744 (e.g., battery), the display 728, the speaker 736, the microphone 738, and the wireless antenna 742 may be external to the system-on-chip device 722 and may be coupled to a component of the system-on-chip device 722, such as an interface or a controller.

It should be noted that although FIG. 7 depicts the user device 700, the processor 701 and memory 732 and wireless components, not all components may be used in the various aspects disclosed. Accordingly, the user device 700 may also be a set top box, a music player, a video player, an entertainment unit, a navigation device, a personal digital assistant (PDA), a fixed location data unit, a computer, a laptop, a tablet, a communications device, a mobile phone, or other similar devices. Further, the user device 700, the processor 701 and memory 732 may also be integrated into automotive applications where reliability is critical, such as an advanced driver-assistance system.

Figure 8:
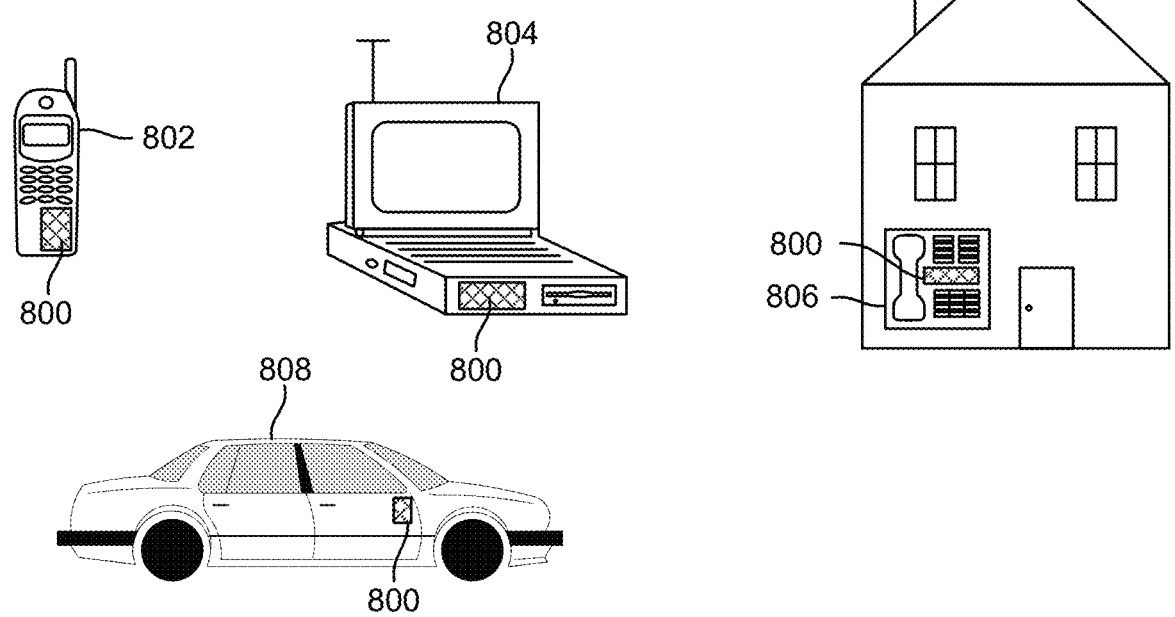
FIG. 8 illustrates various electronic devices that may be integrated with any of the aforementioned devices in accordance with one or more aspects of the disclosure.

FIG. 8 illustrates various electronic devices that may be integrated with any of the aforementioned integrated device or semiconductor device in accordance with various examples of the disclosure. For example, a mobile phone device 802, a laptop computer device 804, a fixed location terminal device 806, and a vehicle 808 may each be considered generally user equipment (UE) and may include a semiconductor device 800, including one or more of the SRAM transistors, logic nominal transistors and logic gate-biased transistors, as described herein. The semiconductor device 800 may be, for example, any of the integrated circuits, dies, integrated devices, integrated device packages, integrated circuit devices, device packages, integrated circuit (IC) packages, package-on-package devices described herein. The devices 802, 804, 806 and 808 illustrated in FIG. 8 are merely exemplary. Other electronic devices may also feature the semiconductor device 800 including, but not limited to a group of devices (e.g., electronic devices) that includes mobile devices, devices in vehicles including one or more processors, such as advanced driver-assistance systems, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), an Internet of things (IoT) device or any other device that stores or retrieves data or computer instructions or any combination thereof.

The foregoing disclosed devices and functionalities may be designed and configured into computer files (e.g., register-transfer level (RTL), Geometric Data Stream (GDS) Gerber, and the like) stored on computer-readable media. Some or all such files may be provided to fabrication handlers who fabricate devices based on such files. Resulting products may include semiconductor wafers that are then cut into semiconductor die and packaged into semiconductor packages, integrated devices, system-on-chip devices, and the like, which may then be employed in the various semiconductor devices described herein.

It will be appreciated that various aspects disclosed herein can be described as functional equivalents to the structures, materials and/or devices described and/or recognized by those skilled in the art. For example, in one aspect, an apparatus may comprise a means for performing the various functionalities discussed above. It will be appreciated that the aforementioned aspects are merely provided as examples and the various aspects claimed are not limited to the specific references and/or illustrations cited as examples.

One or more of the components, processes, features, and/or functions illustrated in FIGS. 1 to 8 may be rearranged and/or combined into a single component, process, feature, or function or incorporated in several components, processes, or functions. Additional elements, components, processes, and/or functions may also be added without departing from the disclosure. It should also be noted that FIGS. 1-8 and corresponding description in the present disclosure are not limited to dies and/or ICs. In some implementations, FIGS. 1 to 8 and the corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and the like.

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, a device in a vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. UEs can be embodied by any of a number of types of devices including but not limited to printed circuit (PC) cards, compact flash devices, external or internal modems, wireless or wireline phones, smartphones, tablets, consumer tracking devices, asset tags, and so on.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE), 5G New Radio, Bluetooth (BT), Bluetooth Low Energy (BLE), IEEE 802.11 (WiFi), and IEEE 802.15.4 (Zigbee/Thread) or other protocols that may be used in a wireless communications network or a data communications network.

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage, or mode of operation. Furthermore, a particular feature and/or structure can be combined with one or more other features and/or structures. Moreover, at least a portion of the apparatus described hereby can be configured to perform at least a portion of a method described hereby.

It should be noted that the terms "connected," "coupled," or any variant thereof, mean any connection or coupling, either direct or indirect, between elements, and can encompass a presence of an intermediate element between two elements that are "connected" or "coupled" together via the intermediate element unless the connection is expressly disclosed as being directly connected.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Those skilled in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Nothing stated or illustrated depicted in this application is intended to dedicate any component, action, feature, benefit, advantage, or equivalent to the public, regardless of whether the component, action, feature, benefit, advantage, or the equivalent is recited in the claims.

Further, those of skill in the art will appreciate that the various illustrative logical blocks, modules, circuits, and algorithm actions described in connection with the examples disclosed herein may be implemented as electronic hardware, computer software, or combinations of both. To clearly illustrate this interchangeability of hardware and software, various illustrative components, blocks, modules, circuits, and actions have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

Although some aspects have been described in connection with a device, it is understood that these aspects also constitute a description of the corresponding method, and so a block or a component of a device should also be understood as a corresponding method action or as a feature of a method action. Analogously thereto, aspects described in connection with or as a method action also constitute a description of a corresponding block or detail or feature of a corresponding device. Some or all of the method actions can be performed by a hardware apparatus (or using a hardware apparatus), such as, for example, a microprocessor, a programmable computer, or an electronic circuit. In some examples, some or a plurality of the most important method actions can be performed by such an apparatus.

In the detailed description above it can be seen that different features are grouped together in examples. This manner of disclosure should not be understood as an intention that the example clauses have more features than are explicitly mentioned in each clause. Rather, the various aspects of the disclosure may include fewer than all features of an individual example clause disclosed. Therefore, the following clauses should hereby be deemed to be incorporated in the description, wherein each clause by itself can stand as a separate example. Although each dependent clause can refer in the clauses to a specific combination with one of the other clauses, the aspect(s) of that dependent clause are not limited to the specific combination. It will be appreciated that other example clauses can also include a combination of the dependent clause aspect(s) with the subject matter of any other dependent clause or independent clause or a combination of any feature with other dependent and independent clauses. The various aspects disclosed herein expressly include these combinations, unless it is explicitly expressed or can be readily inferred that a specific combination is not intended (e.g., contradictory aspects, such as defining an element as both an insulator and a conductor). Furthermore, it is also intended that aspects of a clause can be included in any other independent clause, even if the clause is not directly dependent on the independent clause.

Implementation examples are described in the following numbered clauses:

Clause 1. An apparatus comprising a semiconductor device, wherein the semiconductor device comprises: one or more static random-access memory (SRAM) transistors, each including a first gate spacer structure; one or more logic nominal transistors, each including a second gate spacer structure; and one or more logic gate-biased transistors, each including a third gate spacer structure, wherein the third gate spacer structure is thinner than the first gate spacer structure and wherein the one or more SRAM transistors, the one or more logic nominal transistors, and the one or more logic gate-biased transistors each have a same contacted poly pitch (CPP).

Clause 2. The apparatus of clause 1, wherein the second gate spacer structure has a same thickness as the first gate spacer structure.

Clause 3. The apparatus of clause 1, wherein the second gate spacer structure has a same thickness as the third gate spacer structure.

Clause 4. The apparatus of any of clauses 1 to 3, wherein the second gate spacer structure has at least one different material relative to the first gate spacer structure.

Clause 5. The apparatus of any of clauses 1 to 4, wherein the second gate spacer structure has a different number of spacer layers than the first gate spacer structure.

Clause 6. The apparatus of clause 1, wherein the first gate spacer structure has a first thickness, the second gate spacer structure has a second thickness, and the third gate spacer structure has a third thickness and wherein the first thickness and the second thickness are greater than the third thickness.

Clause 7. The apparatus of any of clauses 1 to 6, wherein the first gate spacer structure has a first thickness, and the third gate spacer structure has a third thickness and wherein the first thickness is twenty percent to thirty percent greater than the third thickness.

Clause 8. The apparatus of any of clauses 1 to 7, wherein the first gate spacer structure comprises a same material as the second gate spacer structure and the third gate spacer structure.

Clause 9. The apparatus of any of clauses 1 to 8, wherein an outer spacer layer of the third gate spacer structure is thinner than an outer spacer layer of the first gate spacer structure.

Clause 10. The apparatus of any of clauses 1 to 9, wherein the first gate spacer structure comprises at least one additional spacer layer than the third gate spacer structure.

Clause 11. The apparatus of clause 1, wherein the second gate spacer structure comprises at least one additional spacer layer than the third gate spacer structure.

Clause 12. The apparatus of any of clauses 1 to 11, wherein the first gate spacer structure, the second gate spacer structure, and the third gate spacer structure comprise at least one of silicon nitride, silicon dioxide, silicon boride, silicon carbide, oxi-nitride, or combinations thereof Clause 13. The apparatus of any of clauses 1 to 12, wherein the one or more SRAM transistors, the one or more logic nominal transistors, and the one or more logic gate-biased transistors are three-dimensional transistors (3D transistors).

Clause 14. The apparatus of clause 13, wherein the 3D transistors are at least one of FinFETs, Nanosheets, Nanowires, or Vertical FETs.

Clause 15. The apparatus of any of clauses 1 to 14, wherein the one or more SRAM transistors each have a first gate length, the one or more logic nominal transistors each have a second gate length, and the one or more logic gate-biased transistors each have a third gate length, and wherein the third gate length is greater than the first gate length and the second gate length.

Clause 16. The apparatus of clause 15, wherein the third gate length is greater than the first gate length by less than three nanometers.

Clause 17. The apparatus of any of clauses 1 to 16, wherein the one or more SRAM transistors each have a first gate-to-gate space, the one or more logic nominal transistors each have a second gate-to-gate space, and the one or more logic gate-biased transistors each have a third gate-to-gate space, and wherein the third gate-to-gate space is smaller than the first gate-to-gate space and the second gate-to-gate space.

Clause 18. The apparatus of any of clauses 1 to 17, wherein the apparatus is selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, an access point, a base station, and a device in a vehicle.

Clause 19. A method for fabricating a semiconductor device, the method comprising: forming one or more static random-access memory (SRAM) transistors, each including a first gate spacer structure; forming one or more logic nominal transistors, each including a second gate spacer structure; and forming one or more logic gate-biased transistors, each including a third gate spacer structure, wherein the third gate spacer structure is thinner than the first gate spacer structure and wherein the one or more SRAM transistors, the one or more logic nominal transistors, and the one or more logic gate-biased transistors each have a same contacted poly pitch (CPP).

Clause 20. The method of clause 19, wherein the second gate spacer structure has a same thickness as the first gate spacer structure.

Clause 21. The method of clause 19, wherein the second gate spacer structure has a same thickness as the third gate spacer structure.

Clause 22. The method of any of clauses 19 to 21, wherein the second gate spacer structure has at least one different material relative to the first gate spacer structure.

Clause 23. The method of any of clauses 19 to 22, wherein the second gate spacer structure has a different number of spacer layers than the first gate spacer structure.

Clause 24. The method of clause 19, wherein the first gate spacer structure has a first thickness, the second gate spacer structure has a second thickness, and the third gate spacer structure has a third thickness and wherein the first thickness and the second thickness are greater than the third thickness.

Clause 25. The method of any of clauses 19 to 24, wherein the first gate spacer structure has a first thickness, and the third gate spacer structure has a third thickness and wherein the first thickness is twenty percent to thirty percent greater than the third thickness.

Clause 26. The method of any of clauses 19 to 25, wherein the first gate spacer structure comprises a same material as the second gate spacer structure and the third gate spacer structure.

Clause 27. The method of any of clauses 19 to 26, wherein an outer spacer layer of the third gate spacer structure is thinner than an outer spacer layer of the first gate spacer structure.

Clause 28. The method of any of clauses 19 to 27, wherein the first gate spacer structure comprises at least one additional spacer layer than the third gate spacer structure.

Clause 29. The method of clause 19, wherein the second gate spacer structure comprises at least one additional spacer layer than the third gate spacer structure.

Clause 30. The method of any of clauses 19 to 29, wherein the first gate spacer structure, the second gate spacer structure, and the third gate spacer structure comprise at least one of silicon nitride, silicon dioxide, silicon boride, silicon carbide, oxi-nitride, or combinations thereof Clause 31. The method of any of clauses 19 to 30, wherein the one or more SRAM transistors each have a first gate length, the one or more logic nominal transistors each have a second gate length, and the one or more logic gate-biased transistors each have a third gate length, and wherein the third gate length is greater than the first gate length and the second gate length.

Clause 32. The method of clause 31, wherein the third gate length is greater than the first gate length by less than three nanometers.

Clause 33. The method of any of clauses 19 to 32, wherein the one or more SRAM transistors each have a first gate-to-gate space, the one or more logic nominal transistors each have a second gate-to-gate space, and the one or more logic gate-biased transistors each have a third gate-to-gate space, and wherein the third gate-to-gate space is smaller than the first gate-to-gate space and the second gate-to-gate space.

Clause 34. The method of any of clauses 19 to 33, further comprising incorporating the semiconductor device into an apparatus, wherein the apparatus is selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, an access point, a base station, and a device in a vehicle.

It should furthermore be noted that methods, systems, and apparatus disclosed in the description or in the claims can be implemented by a device comprising means for performing the respective actions and/or functionalities of the methods disclosed.

Furthermore, in some examples, an individual action can be subdivided into a plurality of sub-actions or contain a plurality of sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. An apparatus comprising a semiconductor device, wherein the semiconductor device comprises:
   one or more static random-access memory (SRAM) transistors, each including a first gate spacer structure and a first gate;
   one or more logic nominal transistors, each including a second gate spacer structure and a second gate; and
   one or more logic gate-biased transistors, each including a third gate spacer structure, a third gate, a S/D epitaxy region adjacent to the third gate spacer structure, and a S/D contact adjacent to the third gate spacer structure and above the S/D epitaxy region, the S/D contact having a top surface and a bottom surface smaller than the top surface, wherein the first gate spacer structure has a different material composition than the second and the third gate spacer structures, the third gate spacer structure is thinner than the first gate spacer structure such that the bottom surface of the S/D contact is directly in contact with a top surface of the S/D epitaxy region, and wherein the one or more SRAM transistors, the one or more logic nominal transistors, and the one or more logic gate-biased transistors each have a same contacted poly pitch (CPP), wherein the third gate spacer structure comprises a plurality of spacer layers laterally adjacent to the third gate, the plurality of spacer layers extending vertically and arranged side-by-side with each other.

2. The apparatus of claim 1, wherein the second gate spacer structure has a same thickness as the first gate spacer structure.

3. The apparatus of claim 1, wherein the second gate spacer structure has a same thickness as the third gate spacer structure.

4. The apparatus of claim 1, wherein the second gate spacer structure has at least one different material relative to the first gate spacer structure.

5. The apparatus of claim 1, wherein the second gate spacer structure has a different number of spacer layers than the first gate spacer structure.

6. The apparatus of claim 1, wherein the first gate spacer structure has a first thickness, the second gate spacer structure has a second thickness, and the third gate spacer structure has a third thickness and wherein the first thickness and the second thickness are greater than the third thickness.

7. The apparatus of claim 1, wherein the first gate spacer structure has a first thickness, and the third gate spacer structure has a third thickness and wherein the first thickness is twenty percent to thirty percent greater than the third thickness.

8. The apparatus of claim 1, wherein an outer spacer layer of the third gate spacer structure is thinner than an outer spacer layer of the first gate spacer structure.

9. The apparatus of claim 1, wherein the first gate spacer structure comprises at least one additional spacer layer than the third gate spacer structure.

10. The apparatus of claim 1, wherein the second gate spacer structure comprises at least one additional spacer layer than the third gate spacer structure.

11. The apparatus of claim 1, wherein the first gate spacer structure, the second gate spacer structure, and the third gate spacer structure comprise at least one of silicon nitride, silicon dioxide, silicon boride, silicon carbide, oxi-nitride, or combinations thereof.

12. The apparatus of claim 1, wherein the one or more SRAM transistors, the one or more logic nominal transistors, and the one or more logic gate-biased transistors are three-dimensional transistors (3D transistors).

13. The apparatus of claim 12, wherein the 3D transistors are at least one of FinFETs, Nanosheets, Nanowires, or Vertical FETs.

14. The apparatus of claim 1, wherein the one or more SRAM transistors each have a first gate length, the one or more logic nominal transistors each have a second gate length, and the one or more logic gate-biased transistors each have a third gate length, and wherein the third gate length is greater than the first gate length and the second gate length.

15. The apparatus of claim 14, wherein the third gate length is greater than the first gate length by less than three nanometers.

16. The apparatus of claim 1, wherein the one or more SRAM transistors each have a first gate-to-gate space, the one or more logic nominal transistors each have a second gate-to-gate space, and the one or more logic gate-biased transistors each have a third gate-to-gate space, and wherein the third gate-to-gate space is smaller than the first gate-to-gate space and the second gate-to-gate space.

17. The apparatus of claim 1, wherein the apparatus is selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, an access point, a base station, and a device in a vehicle.

18. A method for fabricating a semiconductor device, the method comprising:
  forming one or more static random-access memory (SRAM) transistors, each including a first gate spacer structure and a first gate;
  forming one or more logic nominal transistors, each including a second gate spacer structure and a second gate; and
  forming one or more logic gate-biased transistors, each including a third gate spacer structure, a third gate, a S/D epitaxy region adjacent to the third gate spacer structure, and a S/D contact adjacent to the third gate spacer structure and above the S/D epitaxy region, the S/D contact having a top surface and a bottom surface smaller than the top surface, wherein the first gate spacer structure has a different material composition than the second and the third gate spacer structures, the third gate spacer structure is thinner than the first gate spacer structure such that the bottom surface of the S/D contact is directly in contact with a top surface of the S/D epitaxy region, and wherein the one or more SRAM transistors, the one or more logic nominal transistors, and the one or more logic gate-biased transistors each have a same contacted poly pitch (CPP), wherein the third gate spacer structure comprises a plurality of spacer layers laterally adjacent to the third gate, the plurality of spacer layers extending vertically and arranged side-by-side with each other.

19. The method of claim 18, wherein the second gate spacer structure has a same thickness as the first gate spacer structure.

20. The method of claim 18, wherein the second gate spacer structure has a same thickness as the third gate spacer structure.

21. The method of claim 18, wherein the second gate spacer structure has a different number of spacer layers than the first gate spacer structure.

22. The method of claim 18, wherein the first gate spacer structure has a first thickness, the second gate spacer structure has a second thickness, and the third gate spacer structure has a third thickness and wherein the first thickness and the second thickness are greater than the third thickness.

23. The method of claim 18, wherein the first gate spacer structure has a first thickness, and the third gate spacer structure has a third thickness and wherein the first thickness is twenty percent to thirty percent greater than the third thickness.

24. The method of claim 18, wherein an outer spacer layer of the third gate spacer structure is thinner than an outer spacer layer of the first gate spacer structure.

25. The method of claim 18, wherein the first gate spacer structure comprises at least one additional spacer layer than the third gate spacer structure.

26. The method of claim 18, wherein the second gate spacer structure comprises at least one additional spacer layer than the third gate spacer structure.

27. The method of claim 18, wherein the first gate spacer structure, the second gate spacer structure, and the third gate spacer structure comprise at least one of silicon nitride, silicon dioxide, silicon boride, silicon carbide, oxi-nitride, or combinations thereof.

28. The method of claim 18, wherein the one or more SRAM transistors each have a first gate length, the one or more logic nominal transistors each have a second gate length, and the one or more logic gate-biased transistors each have a third gate length, and wherein the third gate length is greater than the first gate length and the second gate length.

29. The method of claim 28, wherein the third gate length is greater than the first gate length by less than three nanometers.

30. The method of claim 18, wherein the one or more SRAM transistors each have a first gate-to-gate space, the one or more logic nominal transistors each have a second gate-to-gate space, and the one or more logic gate-biased transistors each have a third gate-to-gate space, and wherein the third gate-to-gate space is smaller than the first gate-to-gate space and the second gate-to-gate space.

31. The method of claim 18, further comprising incorporating the semiconductor device into an apparatus, wherein the apparatus is selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, an access point, a base station, and a device in a vehicle.

* * * * *